(12) United States Patent
Matsubara et al.

(10) Patent No.: US 10,181,571 B2
(45) Date of Patent: *Jan. 15, 2019

(54) LIGHT-EMITTING ELEMENT, LIGHT EMITTING DEVICE, DISPLAY DEVICE, ELECTRONIC APPLIANCE, AND LIGHTING DEVICE

(71) Applicant: Semiconductor Energy Laboratory Co., Ltd., Kanagawa-ken (JP)

(72) Inventors: Tomoe Matsubara, Tokyo (JP); Satoshi Seo, Kanagawa (JP)

(73) Assignee: Semiconductor Energy Laboratory Co., Ltd. (JP)

(*) Notice: Subject to any disclaimer, the term of this patent is extended or adjusted under 35 U.S.C. 154(b) by 0 days.

This patent is subject to a terminal disclaimer.

(21) Appl. No.: 15/486,876

(22) Filed: Apr. 13, 2017

(65) Prior Publication Data

US 2017/0222169 A1    Aug. 3, 2017

Related U.S. Application Data

(63) Continuation of application No. 14/972,799, filed on Dec. 17, 2015, now Pat. No. 9,627,640, which is a
(Continued)

(30) Foreign Application Priority Data

Aug. 3, 2012    (JP) ................................. 2012-172937

(51) Int. Cl.
*H01L 51/50*    (2006.01)
*H01L 51/00*    (2006.01)

(52) U.S. Cl.
CPC ........ *H01L 51/504* (2013.01); *H01L 51/0051* (2013.01); *H01L 51/5004* (2013.01);
(Continued)

(58) Field of Classification Search
CPC ... H01L 27/32–27/326; H01L 51/50–51/5012; H01L 51/525–51/5287;
(Continued)

(56) References Cited

U.S. PATENT DOCUMENTS 5,409,783 A    4/1995 Tang et al.
5,420,288 A    5/1995 Ohta et al.
(Continued)

FOREIGN PATENT DOCUMENTS

EP    1 202 608 A2    5/2002
EP    2 133 932 A1    12/2009
(Continued)

OTHER PUBLICATIONS

Yersin, H. et al., *Highly Efficient OLEDs with Phosphorescent Materials*, 2008, pp. 1-97,283-309, Wiley-VCH Verlag GmbH & Co.
(Continued)

*Primary Examiner* — Cuong B Nguyen
(74) *Attorney, Agent, or Firm* — Husch Blackwell LLP

(57) ABSTRACT

A multicolor light-emitting element in which light-emitting layers emitting light of different colors are stacked and color adjustment is easily made is provided. A multicolor light-emitting element which is inexpensive and has favorable emission efficiency is provided. A light-emitting element in which at least two light-emitting layers emitting light of different colors are formed in contact with each other and the light emitted from the two light-emitting layers is obtained from exciplexes is provided. In addition, the light-emitting element in which the exciplexes emit delayed fluorescence is provided.

19 Claims, 12 Drawing Sheets

Related U.S. Application Data continuation of application No. 13/955,813, filed on Jul. 31, 2013, now Pat. No. 9,219,243.

(52) U.S. Cl.
CPC ...... *H01L 51/5012* (2013.01); *H01L 51/5056* (2013.01); *H01L 51/5072* (2013.01); *H01L 2251/5338* (2013.01); *H01L 2251/552* (2013.01)

(58) Field of Classification Search
CPC .................. H01L 2227/32–2227/326; H01L 2251/5323–2251/5361; H01L 2924/12044
See application file for complete search history.

(56) References Cited

U.S. PATENT DOCUMENTS

| | | |
|---|---|---|
| 5,597,890 A | 1/1997 | Jenekhe |
| 5,709,492 A | 1/1998 | Yasunaga et al. |
| 6,097,147 A | 8/2000 | Baldo et al. |
| 6,517,957 B1 | 2/2003 | Senoo et al. |
| 6,863,997 B2 | 3/2005 | Thompson et al. |
| 6,867,538 B2 | 3/2005 | Adachi et al. |
| 7,175,922 B2 | 2/2007 | Jarikov et al. |
| 7,183,010 B2 | 2/2007 | Jarikov |
| 7,332,857 B2 | 2/2008 | Seo et al. |
| 7,572,522 B2 | 8/2009 | Seo et al. |
| 7,597,967 B2 | 10/2009 | Kondakova et al. |
| 7,776,457 B2 | 8/2010 | Lee et al. |
| 7,906,226 B2 | 3/2011 | Matsuura et al. |
| 7,943,925 B2 | 5/2011 | Yamazaki |
| 7,993,760 B2 | 8/2011 | Komori et al. |
| 8,026,662 B2 | 9/2011 | Ishihara et al. |
| 8,034,465 B2 | 10/2011 | Liao et al. |
| 8,105,701 B2 | 1/2012 | Matsuura et al. |
| 8,119,255 B2 | 2/2012 | Xia et al. |
| 8,207,526 B2 | 6/2012 | Nishimura et al. |
| 8,247,086 B2 | 8/2012 | Inoue et al. |
| 8,274,214 B2 | 9/2012 | Ikeda et al. |
| 8,519,130 B2 | 8/2013 | Alleyne |
| 8,709,615 B2 | 4/2014 | Kottas et al. |
| 8,722,205 B2 | 5/2014 | Xia et al. |
| 8,778,508 B2 | 7/2014 | Kwong et al. |
| 8,853,680 B2 | 10/2014 | Yamazaki et al. |
| 8,963,127 B2 | 2/2015 | Pieh et al. |
| 8,981,355 B2 | 3/2015 | Seo |
| 8,993,129 B2 | 3/2015 | Endo et al. |
| 8,994,263 B2 | 3/2015 | Shitagaki et al. |
| 9,054,317 B2 | 6/2015 | Monkman et al. |
| 9,065,062 B2 | 6/2015 | Xia et al. |
| 9,159,942 B2 | 10/2015 | Seo et al. |
| 9,175,213 B2 | 11/2015 | Seo et al. |
| 9,184,397 B2 | 11/2015 | Kottas et al. |
| 9,299,944 B2 | 3/2016 | Seo et al. |
| 9,356,250 B2 | 5/2016 | Ohsawa et al. |
| 9,604,928 B2 | 3/2017 | Shitagaki et al. |
| 9,627,640 B2 * | 4/2017 | Matsubara ............ H01L 51/504 |
| 2003/0175553 A1 | 9/2003 | Thompson et al. |
| 2004/0104394 A1 | 6/2004 | Lin et al. |
| 2005/0048310 A1 | 3/2005 | Cocchi et al. |
| 2005/0064237 A1 | 3/2005 | Kato et al. |
| 2005/0106415 A1 | 5/2005 | Jarikov et al. |
| 2005/0196775 A1 | 9/2005 | Swager et al. |
| 2005/0221116 A1 | 10/2005 | Cocchi et al. |
| 2006/0134464 A1 | 6/2006 | Nariyuki |
| 2006/0228577 A1 | 10/2006 | Nagara |
| 2007/0090756 A1 | 4/2007 | Okada et al. |
| 2007/0222374 A1 | 9/2007 | Egawa et al. |
| 2007/0244320 A1 | 10/2007 | Inoue et al. |
| 2007/0247829 A1 | 10/2007 | Fiedler et al. |
| 2008/0160345 A1 | 7/2008 | Inoue et al. |
| 2008/0217604 A1 | 9/2008 | Yokoyama et al. |
| 2008/0286604 A1 | 11/2008 | Inoue et al. |
| 2008/0297036 A1 | 12/2008 | Noh et al. |
| 2010/0052527 A1 | 3/2010 | Ikeda et al. |
| 2010/0117068 A1 | 5/2010 | Inoue et al. |
| 2010/0145044 A1 | 6/2010 | Inoue et al. |
| 2010/0184942 A1 | 7/2010 | Chen et al. |
| 2011/0001146 A1 | 1/2011 | Yamazaki et al. |
| 2011/0025202 A1 | 2/2011 | Fujita |
| 2011/0133172 A1 | 6/2011 | Suzuki et al. |
| 2011/0175067 A1 | 7/2011 | Sugi et al. |
| 2011/0204353 A1 | 8/2011 | Yamazaki |
| 2011/0210316 A1 | 9/2011 | Kadoma et al. |
| 2011/0215714 A1 | 9/2011 | Seo et al. |
| 2011/0240967 A1 | 10/2011 | Lee et al. |
| 2012/0068170 A1 | 3/2012 | Pflumm et al. |
| 2012/0098417 A1 | 4/2012 | Inoue et al. |
| 2012/0205632 A1 | 8/2012 | Shitagaki et al. |
| 2012/0205687 A1 | 8/2012 | Yamazaki et al. |
| 2012/0206035 A1 | 8/2012 | Shitagaki et al. |
| 2012/0217486 A1 | 8/2012 | Takemura et al. |
| 2012/0217487 A1 | 8/2012 | Yamazaki et al. |
| 2012/0217869 A1 | 8/2012 | Adachi et al. |
| 2012/0242219 A1 | 9/2012 | Seo et al. |
| 2012/0248421 A1 | 10/2012 | Yamazaki et al. |
| 2012/0256535 A1 | 10/2012 | Seo et al. |
| 2012/0267618 A1 | 10/2012 | Monkman et al. |
| 2013/0048964 A1 | 2/2013 | Takeda et al. |
| 2013/0069090 A1 | 3/2013 | Sawabe et al. |
| 2013/0075782 A1 | 3/2013 | Ikeda et al. |
| 2013/0165653 A1 | 6/2013 | Inoue et al. |
| 2013/0240851 A1 | 9/2013 | Seo et al. |
| 2013/0270531 A1 | 10/2013 | Seo et al. |
| 2013/0277654 A1 | 10/2013 | Seo et al. |
| 2013/0277655 A1 | 10/2013 | Seo et al. |
| 2013/0277656 A1 | 10/2013 | Seo et al. |
| 2013/0292656 A1 | 11/2013 | Seo et al. |
| 2013/0306945 A1 | 11/2013 | Seo |
| 2014/0034927 A1 | 2/2014 | Seo et al. |
| 2014/0034930 A1 | 2/2014 | Seo et al. |
| 2014/0061604 A1 | 3/2014 | Seo et al. |
| 2014/0203268 A1 | 7/2014 | Xia et al. |
| 2014/0284585 A1 | 9/2014 | Kwong et al. |
| 2015/0069352 A1 | 3/2015 | Kim et al. |
| 2016/0099425 A1 | 4/2016 | Kottas et al. |

FOREIGN PATENT DOCUMENTS

| | | |
|---|---|---|
| EP | 2 363 398 A1 | 9/2011 |
| EP | 2 366 753 A1 | 9/2011 |
| EP | 2 551 933 A1 | 1/2013 |
| JP | 07-085972 A | 3/1995 |
| JP | 2000-133453 A | 5/2000 |
| JP | 2004-522276 | 7/2004 |
| JP | 2005-285708 A | 10/2005 |
| JP | 2007-073620 A | 3/2007 |
| JP | 2008-288344 A | 11/2008 |
| JP | 2010-033780 A | 2/2010 |
| JP | 2010-135689 A | 6/2010 |
| JP | 2011-153269 A | 8/2011 |
| JP | 2011-201869 A | 10/2011 |
| JP | 2011-204673 A | 10/2011 |
| JP | 2011-216628 A | 10/2011 |
| JP | 2012-004526 A | 1/2012 |
| JP | 2012-193352 A | 10/2012 |
| JP | 2013-125653 A | 6/2013 |
| KR | 2011-0099645 A | 9/2011 |
| TW | 200908777 | 2/2009 |
| TW | 201038563 | 11/2010 |
| WO | WO 2000/070655 A2 | 11/2000 |
| WO | WO 2008/073440 A2 | 6/2008 |
| WO | WO 2009/073245 A1 | 6/2009 |
| WO | WO 2009/073246 A1 | 6/2009 |
| WO | WO 2009/142030 A1 | 11/2009 |
| WO | WO 2010/111175 A1 | 9/2010 |

OTHER PUBLICATIONS

Tokito,S. et al., "Improvement in Performance by Doping," Organic EL Display, Aug. 20, 2004, pp. 67-99, Ohmsha.

(56) References Cited

OTHER PUBLICATIONS

Jeon, W.S. et al., "Ideal Host and Guest System in Phosphorescent OLEDs," Organic Electronics, 2009, vol. 10, pp. 240-246, Elsevier.
Su, S-J et al., "RGB Phosphorescent Organic Light-Emitting Diodes by Using Host Materials with Heterocyclic Cores:Effect of Nitrogen Atom Orientations," Chemistry of Materials, 2011, vol. 23, No. 2, pp. 274-284.
Rausch, A.F. et al., "Matrix Effects on the Triplet State of the OLED Emitter Ir(4,6-dFppy)2(pic)(FIrpic):Investigations by High-Resolution Optical Spectroscopy," Inorganic Chemistry, 2009, vol. 48, No. 5, pp. 1928-1937.
Gong, X. et al., "Phosphorescence from Iridium Complexes Doped into Polymer Blends," Journal of Applied Physics, Feb. 1, 2004, vol. 95, No. 3, pp. 948-953.
Zhao, Q. et al., "Synthesis and Photophysical, Electrochemical, and Electrophosphorescent Properties of a Series of Iridium(III) Complexes Based on Quinoline Derivatives and Different β-Diketonate Ligands," Organometallics, Jun. 14, 2006, vol. 25, No. 15, pp. 3631-3638.
Chen, F-C. et al., "Triplet Exciton Confinement in Phosphorescent Polymer Light-Emitting Diodes," Applied Physics Letters, Feb. 17, 2003, vol. 82, No. 7, pp, 1006-1008.
Lee, J.Y. et al., "Stabilizing the Efficiency of Phosphorescent Organic Light-Emitting Diodes," SPIE Newsroom, Apr. 21, 2008, pp. 1-3.
Tokito, S. et al., "Confinement of Triplet Energy on Phosphorescent Molecules for Highly-Efficient Organic Blue-Light-Emitting Devices," Applied Physics Letters, Jul. 21, 2003, vol. 83, No. 3, pp. 569-571.
Endo, A. et al., "Efficient Up-Conversion of Triplet Excitons Into a Singlet State and Its Application for Organic Light Emitting Diodes," Applied Physics Letters, Feb. 24, 2011, vol. 98, No. 8, pp. 083302-1-083302-3.
Park, Y-S. et al., "Efficient Triplet Harvesting by Fluorescent Molecules Through Exciplexes for High Efficiency Organic Light-Emitting Diodes," Applied Physics Letters, Apr. 18, 2013, vol. 102, No. 15, pp. 153306-1-153306-5.
Baldo, M.A. et al., "Highly Efficient Phosphorescent Emission From Organic Electroluminescent Devices," Nature, Sep. 10, 1998, vol. 395, pp. 151-154.
Baldo, M.A. et al., "Very High-Efficiency Green Organic Light-Emitting Devices Based on Electrophosphorescence," Applied Physics Letters, Jul. 5, 1999, vol. 75, No. 1, pp. 4-6.
Gu, G. et al., "Transparent Organic Light Emitting Devices," Applied Physics Letters, May 6, 1996, vol. 68, No. 19, pp. 2606-2608.
Choong, V-E. et al., "Organic Light-Emitting Diodes With a Bipolar Transport Layer," Applied Physics Letters, Jul. 12, 1999, vol. 75, No. 2, pp. 172-174.
Adachi, C. et al., "Nearly 100% Internal Phosphorescence Efficiency in an Organic Light Emitting Device," Journal of Applied Physics, Nov. 15, 2001, vol. 90, No. 10, pp. 5048-5051.
Baldo, M.A. et al., "Prospects for Electrically Pumped Organic Lasers," Physical Review. B, Jul. 19, 2002, vol. 66, pp. 035321-1-035321-16.
Markham, J.P.J. et al., "High-Efficiency Green Phosphorescence from Spin-Coated Single-Layer Dendrimer Light-Emitting Diodes," Applied Physics Leters, Apr. 15, 2002, vol. 80, No. 15, pp. 2645-2647.
Itano, K. et al., "Exciplex Formation at the Organic Solid-State Interface: Yellow Emission in Organic Light-Emitting Diodes Using Green-Fluorescent tris(8-quinolinolato)aluminum and Hole-Transporting Molecular Materials with Low Ionization Potentials," Applied Physics Letters, Feb. 9, 1998, vol. 72, No. 6, pp. 636-638.
Kondakova, M.E. et al., "High-Efficiency, Low-Voltage Phosphorescent Organic Light-Emitting Diode Devices with Mixed Host," Journal of Applied Physics, Nov. 4, 2008, vol. 104, pp. 094501-1-094501-17.
Seo, J.H. et al., "Efficient Blue-Green Organic Light-Emitting Diodes Based on Heteroleptic tris-cyclometalated iridium(III) Complexes," Thin Solid Films, Sep. 25, 2008, vol. 517, No. 5, pp. 1807-1810.
Fujita, M. et al., "Reduction of Operating Voltage in Organic Light-Emitting Diode by Corrugated Photonic Crystal Structure," Applied Physics Letters, Dec. 6, 2004, vol. 85, No. 23, pp. 5769-5771.
Goushi, K. et al., "Efficient Organic Light-Emitting Diodes Through Up-Conversion from Triplet to Singlet Excited States of Exciplexes," Applied Physics Letters, Jul. 12, 2012, vol. 101, No. 2, pp. 023306-1-023306-4.
Hind, Y. et al., "Red Phosphorescent Organic Light-Emitting Diodes Using Mixture System of Small-Molecule and Polymer Host," Japanese Journal of Applied Physics, Apr. 21, 2005, vol. 44, No. 4B, pp. 2790-2794.
Taiwanese Office Action re Application No. TW 102125935, dated Aug. 26, 2016.
Adachi, C. et al., "High-Efficiency Organic Electrophosphorescent Devices With Tris(2-Phenylpyridine)Iridium Doped Into Electron-Transporting Materials," Applied Physics Letters, Aug. 7, 2000, vol. 77, No. 6, pp. 904-906.
Ikai, M. et al., "Highly Efficient Phosphorescence From Organic Light-Emitting Devices With an Exciton-Block Layer," Applied Physics Letters, Jul. 9, 2001, vol. 79, No. 2, pp. 156-158.
King, K.A. et al., "Excited-State Properties of a Triply Ortho-Metalated Iridium(III) Complex," Journal of the American Chemical Society, Mar. 1, 1985, vol. 107, No. 5, pp. 1431-1432, ACS (American Chemical Society).
Tsuboyama, A. et al., "Homoleptic Cyclometalated Iridium Complexes with Highly Efficient Red Phosphorescence and Application to Organic Light-Emitting Diode," Journal of the American Chemical Society, 2003, vol. 125, No. 42, pp. 12971-12979.
Zang, F. et al., STN International HCAPLUS database, American Institute of Physics.
Cai, C. et al., STN International HCAPLUS database, Elsevier B.V. "CN: 1,4-Benzenediamine, N1,N4-bis ([1,1'-biphenyl-4-yl)-N1,N4-bis (9,9-dimethyl-9H-fluoren-2-yl)," STN, CAS Registry Record.
Taiwanese Office Action re Application No. TW 106107049, dated Mar. 9, 2018.

* cited by examiner

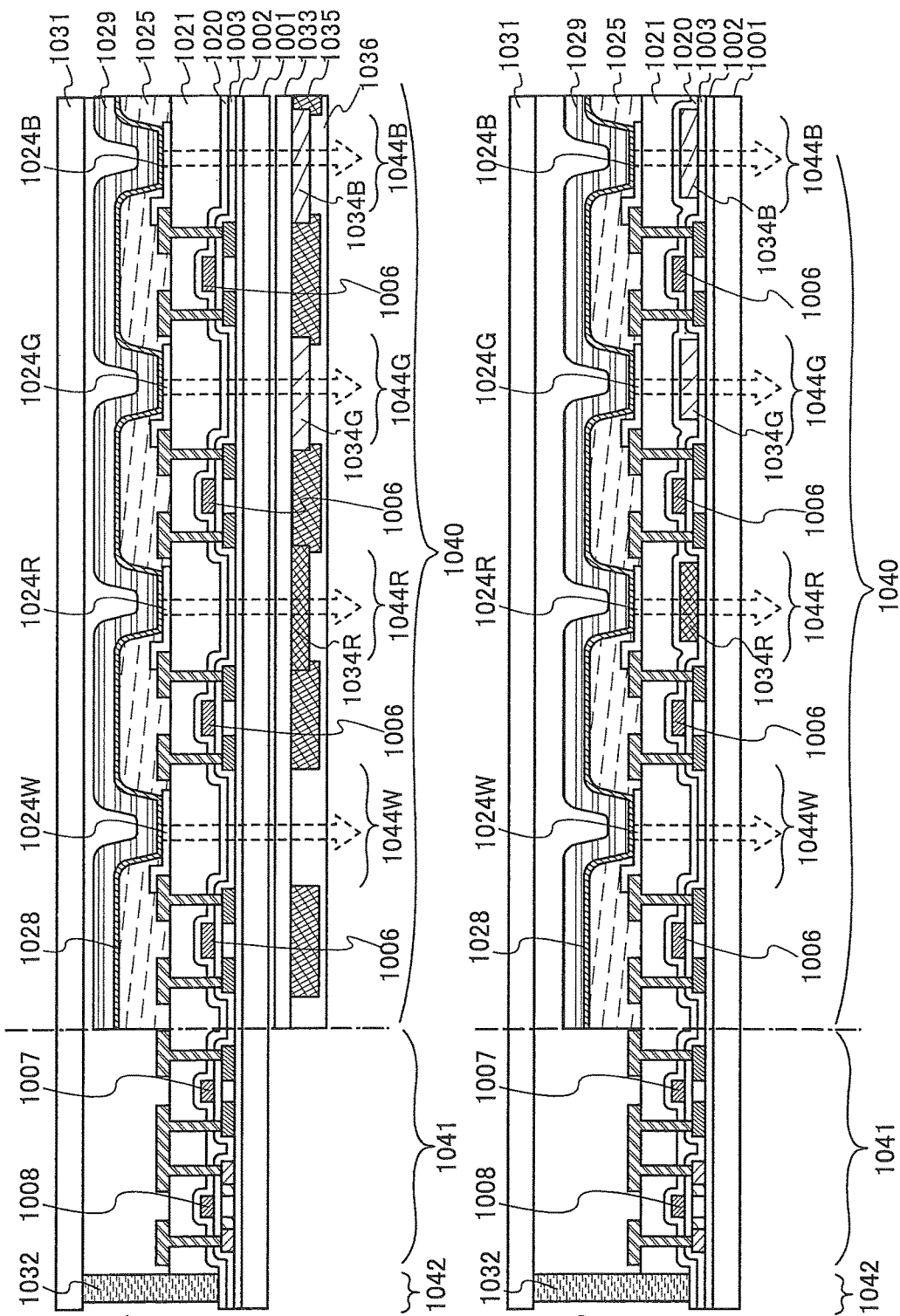

FIG. 7A
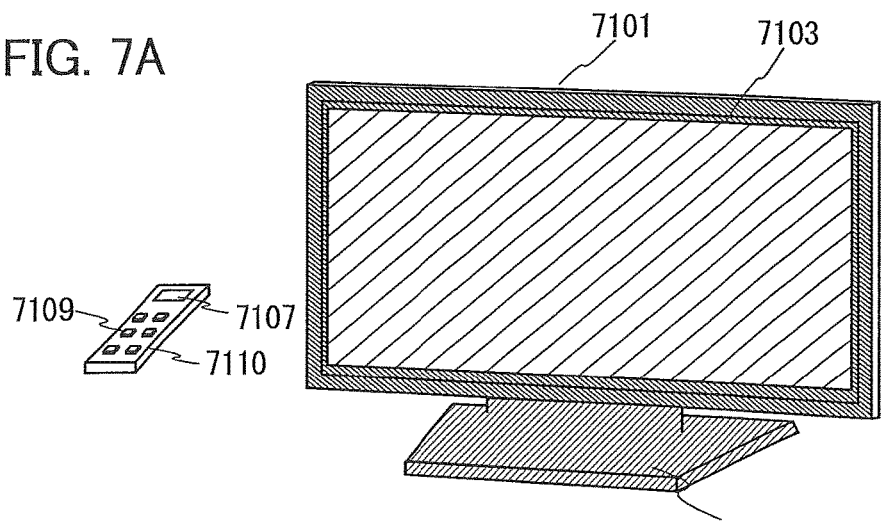
FIG. 7B1
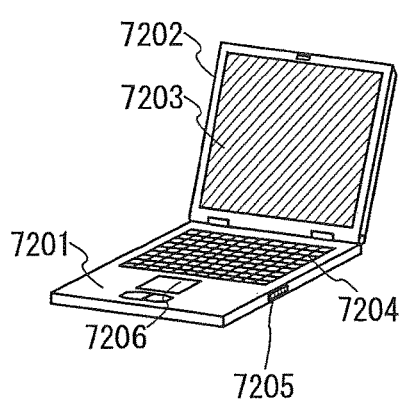
FIG. 7B2
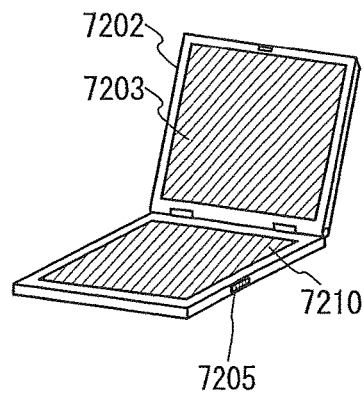
FIG. 7C
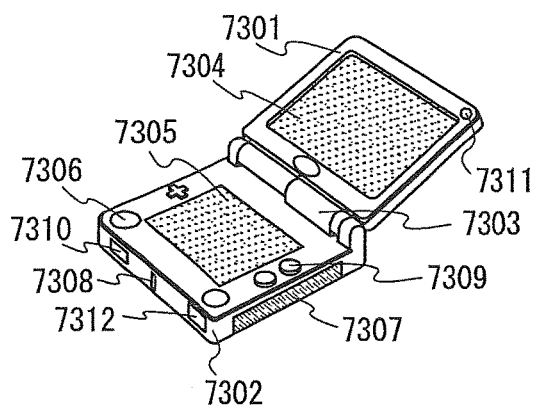
FIG. 7D
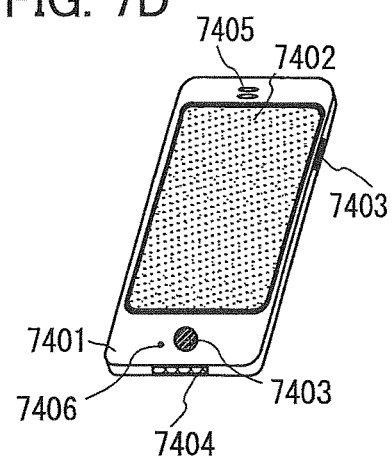

LIGHT-EMITTING ELEMENT, LIGHT EMITTING DEVICE, DISPLAY DEVICE, ELECTRONIC APPLIANCE, AND LIGHTING DEVICE

This application is a continuation of copending U.S. application Ser. No. 14/972,799, filed on Dec. 17, 2015 which is a continuation of U.S. application Ser. No. 13/955,813, filed on Jul. 31, 2013 (now U.S. Pat. No. 9,219,243 issued Dec. 22, 2015), which are all incorporated herein by reference.

BACKGROUND OF THE INVENTION

1. Field of the Invention

The present invention relates to a light-emitting element, a display device, a light-emitting device, an electronic appliance, and a lighting device each of which uses an organic compound as a light-emitting substance.

2. Description of the Related Art

In recent years, research and development of a light-emitting element (organic EL element) which uses an organic compound and utilizes electroluminescence (EL) have been actively promoted. In the basic structure of such a light-emitting element, an organic compound layer containing a light-emitting substance (an EL layer) is interposed between a pair of electrodes. By voltage application to this element, light emission from the light-emitting substance can be obtained.

Such a light-emitting element is a self-luminous element and has advantages over a liquid crystal display in having high pixel visibility and eliminating the need for backlights, for example; thus, such a light-emitting element is thought to be suitable for a flat panel display element. A display including such a light-emitting element is also highly advantageous in that it can be thin and lightweight. Besides, very high speed response is one of the features of such an element.

In such a light-emitting element, light-emitting layers can be successively formed two-dimensionally, so that planar light emission can be obtained. Thus, a large-area element can be easily formed. This feature is difficult to obtain with point light sources typified by incandescent lamps and LEDs or linear light sources typified by fluorescent lamps. Thus, the light-emitting element also has great potential as a planar light source which can be applied to a lighting device and the like.

It is important to obtain white light so that the light-emitting element is used for lighting. In general, white light can be obtained with the use of a multicolor light-emitting element which emits light obtained by combining light from a plurality of emission center substances having different emission spectra.

Disclosed in Patent Document 1 is a structure in which a layer for color adjustment is additionally provided in a light-emitting element in which a plurality of light-emitting layers is stacked. However, this structure increases the number of constituent elements, and thus is disadvantageous in terms of cost.

REFERENCE

[Patent Document 1] Japanese Published Patent Application No. 2010-033780

SUMMARY OF THE INVENTION

In the above-described multicolor light-emitting element, obtaining emission of light with different wavelengths at the same time has the same meaning as obtaining emission of light from different energy levels at the same time. However, there is inevitably a difference in level in the emission of light from different energy levels, and as a result, energy transfer might occur.

For this reason, such an element needs to be precisely designed in view of energy transfer so that a desired emission color is obtained. However, such design takes time and effort.

In view of the above, an object of one embodiment of the present invention is to provide a multicolor light-emitting element in which light-emitting layers emitting light of different colors are stacked, in which color adjustment is easily made.

Another object of one embodiment of the present invention is to provide a multicolor light-emitting element which is inexpensive and has favorable emission efficiency.

Another object of one embodiment of the present invention is to provide a multicolor light-emitting element in which color adjustment is easily made and which is inexpensive and has favorable emission efficiency.

Another object of one embodiment of the present invention is to provide a light-emitting device, a display device, an electronic appliance, and a lighting device each of which can be manufactured at low cost by using any of the above-described light-emitting elements.

Another object of one embodiment of the present invention is to provide a light-emitting device, a display device, an electronic appliance, and a lighting device each of which has reduced power consumption by using any of the above light-emitting elements.

It is only necessary that at least one of the above-described objects be achieved in the present invention.

In a light-emitting element in which at least two light-emitting layers emitting light of different colors are formed in contact with each other, light emission of each of the light-emitting layers is obtained from an exciplex, so that the above-described objects can be achieved.

One embodiment of the present invention is a light-emitting element which includes a first electrode, a second electrode, and an EL layer interposed between the first electrode and the second electrode. The EL layer includes at least a light-emitting layer in which a first light-emitting layer and a second light-emitting layer are stacked. The first light-emitting layer contains a first organic compound and a second organic compound. The second light-emitting layer contains a third organic compound and a fourth organic compound. The combination of the first organic compound and the second organic compound forms a first exciplex. The combination of the third organic compound and the fourth organic compound forms a second exciplex.

In a normal light-emitting element, in which light-emitting substances which are not an exciplex are used, energy transfer occurs between the light-emitting substances, between host materials, or between the light-emitting substance and the host material because of a difference in band gaps or triplet excited levels. For this reason, adjustment of the light-emitting element, such as adjustment of an element structure or doping concentration, which is for obtaining light emission from a plurality of light-emitting layers, becomes complicated. In contrast, energy transfer between exciplexes is less likely to occur; thus, in a light-emitting element having the above-described structure, light emission can be obtained from two light-emitting layers without difficulty.

The singlet excited level and the triplet excited level of an exciplex are close to each other; thus, reverse intersystem crossing from the triplet excited state to the singlet excited state easily occurs, and delayed fluorescence is easily exhibited. Since the delayed fluoresce can convert the triplet excited level to fluorescence, emission efficiency of a light-emitting can be increased. The difference between the singlet excited state and the triplet excited state is preferably less than or equal to 0.2 eV, more preferably less than or equal to 0.1 eV so that delayed fluorescence is efficiently exhibited.

In view of the above, another embodiment of the present invention is a light-emitting element having the above-described structure, in which the first exciplex exhibits delayed fluorescence.

Another embodiment of the present invention is a light-emitting element having the above-described structure, in which the second exciplex exhibits delayed fluorescence.

Another embodiment of the present invention is a light-emitting element having the above-described structure, in which both of the first exciplex and the second exciplex exhibit delayed fluorescence.

Another embodiment of the present invention is a light-emitting element having the above-described structure, which has an external quantum efficiency of 5% or higher.

Further, in any of the above-described light-emitting elements, a recombination region is formed at an interface between the light-emitting layers, so that both of the light-emitting layers can efficiently emit light. Further, one of the two substances forming an exciplex has an electron-transport property and the other substance has a hole-transport property, which is advantageous for formation of the exciplex. Moreover, in such a case, the transport properties of the light-emitting layers can be easily adjusted depending on the mixture ratio between the two substances, and the recombination region can be easily adjusted.

Thus, another embodiment of the present invention is a light-emitting element having the above-described structure, in which an electron-hole recombination region in the light-emitting layer is at an interface between the first light-emitting layer and the second light-emitting layer.

Another embodiment of the present invention is a light-emitting element having the above-described structure, in which one of the first organic compound and the second organic compound is a substance having an electron-transport property and the other is a substance having a hole-transport property, and one of the third organic compound and the fourth organic compound is a substance having an electron-transport property and the other is a substance having a hole-transport property.

Another embodiment of the present invention is a light-emitting element having the above-described structure, in which one of the first electrode and the second electrode functions as an anode and the other functions as a cathode, one of the first light-emitting layer and the second light-emitting layer, which is positioned on the side where the electrode functioning as the anode is formed, contains a large amount of substance having a hole-transport property and the other, which is positioned on the side where the electrode functioning as the cathode is formed, contains a large amount of substance having an electron-transport property.

Note that in any of the above-described light-emitting elements, the exciplexes emit light with different wavelengths, so that multicolor light can be obtained by a combination of colors of light emitted from the exciplexes. When the exciplexes emit light of complementary colors, white light can be obtained.

Thus, another embodiment of the present invention is a light-emitting element having the above-described structure, in which the first exciplex and the second exciplex emit light having peaks at different wavelengths.

Another embodiment of the present invention is a light-emitting element having the above-described structure, in which an emission spectrum has at least two peaks.

Another embodiment of the present invention is a light-emitting element having the above-described structure, which exhibits white light emission.

The emission wavelength of the exciplex can be changed by changing one of the two substances forming the exciplex. In other words, one of the two substances forming an exciplex can be common in a plurality of light-emitting layers. The number of constituent elements is reduced, so that the element can be manufactured more easily at lower cost.

Thus, another embodiment of the present invention is a light-emitting element having the above-described structure, in which one of the first organic compound and the second organic compound is the same as one of the third organic compound and the fourth organic compound.

Another embodiment of the present invention is a light-emitting module which includes the light-emitting element having any of the above-described structures and a means which controls the light-emitting element.

Another embodiment of the present invention is a display module which includes the light-emitting element having any of the above-described structures in a display portion and a means which controls the light-emitting element.

Another embodiment of the present invention is a lighting device which includes the light-emitting element having any of the above-described structures.

Another embodiment of the present invention is a light-emitting device which includes the light-emitting element having any of the above-described structures and a means which controls the light-emitting element.

Another embodiment of the present invention is a display device which includes the light-emitting element having any of the above-described structures in a display portion and a means which controls the light-emitting element.

Another embodiment of the present invention is an electronic appliance which includes the light-emitting element having any of the above-described structures.

The light-emitting device in this specification includes an image display device using a light-emitting element. Further, the category of the light-emitting device in this specification includes a module in which a light-emitting element is provided with a connector such as an anisotropic conductive film or a tape carrier package (TCP); a module in which the end of the TCP is provided with a printed wiring board; and a module in which an IC (integrated circuit) is directly mounted on a light-emitting element by a COG (chip on glass) method. Furthermore, the category includes light-emitting devices which are used in lighting equipment or the like.

According to one embodiment of the present invention, a multicolor light-emitting element in which light-emitting layers emitting light of different colors are stacked, in which color adjustment is easily made can be provided.

According to another embodiment of the present invention, a multicolor light-emitting element which is inexpensive and has favorable emission efficiency can be provided.

According to another embodiment of the present invention, a multicolor light-emitting element in which color adjustment is easily made and which is inexpensive and has favorable emission efficiency can be provided.

According to another embodiment of the present invention, a light-emitting device, a display device, an electronic appliance, and a lighting device each of which can be manufactured at low cost by using any of the above-described light-emitting elements can be provided.

According to another embodiment of the present invention, a light-emitting device, a display device, an electronic appliance, and a lighting device each of which has reduced power consumption by using any of the above-described light-emitting elements can be provided.

BRIEF DESCRIPTION OF THE DRAWINGS

FIGS. 3A and 3B are conceptual diagrams of passive matrix light-emitting devices.

FIGS. 7A, 7B1, 7B2, 7C, and 7D illustrate electronic appliances.

DETAILED DESCRIPTION OF THE INVENTION

Hereinafter, embodiments of the present invention will be described with reference to the accompanying drawings. Note that the present invention is not limited to the following description, and it will be easily understood by those skilled in the art that various changes and modifications can be made without departing from the spirit and scope of the present invention. Therefore, the invention should not be construed as being limited to the description in the embodiments below.

Embodiment 1

As a multicolor light-emitting element in which light is obtained from a plurality of light-emitting substances, the following light-emitting elements have been proposed: a light-emitting element in which a plurality of emission center substances are contained in one light-emitting layer, a light-emitting element in which a plurality of light-emitting layers containing different emission center substances are stacked, a light-emitting element in which an intermediate layer is provided between light-emitting layers containing different emission center substances, and the like.

It is known that in the light-emitting elements other than the light-emitting element in which the intermediate layer is provided, energy transfer directly between the emission center substances or through a host material occurs and significantly affects emission efficiency or an emission color.

The energy transfer is controlled by an element structure, selection of a host material or an emission center substance, the presence or absence of an additive substance, the amount of the additive substance, and the like; however, adjusting them needs a lot of effort.

In addition, the element including the intermediate layer has disadvantages such as an increase in cost due to an increase in the number of layers to be formed and an increase in driving voltage.

In view of the above, in one embodiment of the present invention, a multicolor light-emitting element is provided in which a first light-emitting layer and a second light-emitting layer are stacked, light with different wavelengths is obtained from the first and second light-emitting layers, and light obtained by a combination of the light with different wavelengths is exhibited. The light obtained from the light-emitting layers is obtained from exciplexes.

Figure 1:
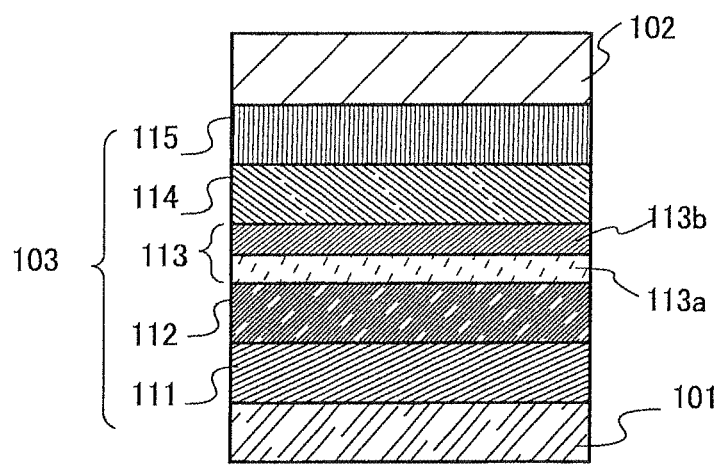
FIG. 1 is a conceptual diagram of a light-emitting element.

FIG. 1 is a schematic diagram of the light-emitting element of this embodiment. In the light-emitting element of this embodiment, an EL layer 103 is interposed between a first electrode 101 and a second electrode 102. One of the first electrode 101 and the second electrode 102 functions as an anode and the other functions as a cathode. Note that in FIG. 1, the first electrode 101 functions as an anode, and the second electrode 102 functions as a cathode.

The EL layer 103 includes at least a light-emitting layer 113. There is no particular limitation on the layers other than the light-emitting layer 113 in the EL layer 103; for example, a hole-injection layer 111, a hole-transport layer 112, an electron-transport layer 114, and an electron-injection layer 115 are included as illustrated in FIG. 1.

The light-emitting layer 113 includes a first light-emitting layer 113a and a second light-emitting layer 113b. The first light-emitting layer 113a contains at least a first organic compound and a second organic compound. The second light-emitting layer 113b contains at least a third organic compound and a fourth organic compound. Note that the first light-emitting layer 113a may consist of only the first organic compound and the second organic compound. In a similar manner, the second light-emitting layer 113b may consist of only the third organic compound and the fourth organic compound.

An exciplex here is an excited state formed from two kinds of substances. In the case of photoexcitation, the exciplex is formed in such a manner that one molecule in an excited state takes in the other substance in a ground state. Thus, when the exciplex emits light to be in a ground state, it returns to be the original substances. For this reason, a ground state of the exciplex does not exist and energy transfer to the exciplex does not occur in principle. Thus, the light-emitting element of this embodiment, in which energy transfer between the light-emitting layers is suppressed, does not need complicated adjustment of the element structure for controlling energy transfer, so that desired light emission can be easily obtained from both of the light-emitting layers.

The exciplex is formed from two kinds of organic compounds as described above. Thus, the first light-emitting layer 113a contains at least the first organic compound and the second organic compound, and the second light-emitting layer 113b contains at least the third organic compound and the fourth organic compound. In addition, the combination of the first organic compound and the second organic compound and the combination of the third organic compound and the fourth organic compound each form at least an exciplex.

A combination, in which one of the two kinds of organic compounds is a compound which easily accepts electrons (a material having an electron-transport property) and the other is a compound which easily accepts holes (a material having a hole-transport property), is preferable because the combination is advantageous for formation of an exciplex.

When one of the two kinds of organic compounds is the material having an electron-transport property and the other is the material having a hole-transport property, the content ratio between the two kinds of organic compounds in the light-emitting layer 113 is adjusted, whereby the carrier balance in the light-emitting layer 113 can be easily adjusted.

In the light-emitting element of this embodiment, a carrier recombination region is formed in the vicinity of an interface between the first light-emitting layer 113a and the second light-emitting layer 113b, whereby excited energy can be distributed to the first light-emitting layer 113a and the second light-emitting layer 113b in a balanced manner; thus, light emission can be obtained from each light-emitting layer without difficulty. Further, when the combination of the first organic compound and the second organic compound and the combination of the third organic compound and the fourth organic compound are each made to be a combination of the compound which easily accepts electrons (the material having an electron-transport property) and the compound which easily accepts holes (the material having a hole-transport property), by adjusting the mixture ratio, the recombination region can be easily adjusted so that it is formed at the interface between the first light-emitting layer 113a and the second light-emitting layer 113b. Note that the intensity of emission from each light-emitting layer can be controlled by shifting the position of the recombination region; thus, the emission spectrum of the light-emitting element can be easily adjusted. One of the first light-emitting layer 113a and the second light-emitting layer 113b, which is closer to the anode than the other light-emitting layer, may be a hole-transport layer, and the other light-emitting layer, which is closer to the cathode than the one light-emitting layer, may be an electron-transport layer in order to form the carrier recombination region in the vicinity of the interface between the first light-emitting layer 113a and the second light-emitting layer 113b. Note that the hole-transport layer may contain a large amount of material having a hole-transport property and the electron-transport layer may contain a large amount of material having an electron-transport property.

An exciplex exhibits light emission based on a difference in energy between a shallower HOMO level (the absolute value thereof is smaller) of one of the two kinds of substances forming the exciplex and a deeper LUMO level (the absolute value thereof is larger) of the other substance. Thus, even when one of the first organic compound and the second organic compound is the same as one of the third organic compound and the fourth organic compound, light with different wavelengths can be obtained from the first light-emitting layer and the second light-emitting layer. When one of the substances forming an exciplex in the first light-emitting layer is the same as one of the substances forming an exciplex in the second light-emitting layer, fewer kinds of materials for forming the light-emitting element are used, so that the light-emitting element can be manufactured more easily at lower cost. For this reason, the light-emitting element can be suitable for mass production. Moreover, a carrier injection barrier at the interface between the first light-emitting layer and the second light-emitting layer can be lowered, which contributes to an increase in the lifetime of the element.

Here, the excited states of an organic compound are a singlet excited state and a triplet excited state, and light from the singlet excited state (S1) is referred to as fluorescence, and light from the triplet excited state (T1) is referred to as phosphorescence. The statistical generation ratio of the excited states in the light-emitting element is considered to be S1:T1=1:3. Thus, a light-emitting element using a phosphorescent compound capable of converting the triplet excited state into light emission can have higher emission efficiency than a light-emitting element using a fluorescent compound. For this reason, a light-emitting element using a phosphorescent compound has been actively developed recently.

However, most phosphorescent compounds currently available are complexes containing a rare metal such as iridium as a central metal, which raises concern about the cost and the stability of supply.

As an emission mechanism capable of converting the triplet excited energy into light emission, there is delayed fluorescence besides the above-described phosphorescence. The delayed fluorescence has a mechanism in which the triplet excited state is upconverted into the singlet excited state through reverse intersystem crossing, so that light emission is exhibited. The use of the delayed fluorescence makes it possible to obtain fluorescence with an internal quantum efficiency exceeding 25%, which is considered to be the upper limit of the internal quantum efficiency of fluorescence.

The delayed fluorescence is likely to occur when the singlet excited state and the triplet excited state are close to each other. Since the singlet excited state and the triplet excited state of an exciplex are close to each other, delayed fluorescence is easily exhibited. The use of an exciplex which efficiently exhibits delayed fluorescence in the light-emitting element of this embodiment can make the triplet excited state contribute to light emission, so that the light-emitting element can have high emission efficiency. Note that the delayed fluorescence here includes what is called thermally activated delayed fluorescence (TADF) in which efficiency of reverse intersystem crossing is increased by some heating (including self heat generation). In order that delayed fluorescence can be efficiently exhibited, the difference in energy between the singlet excited state and the triplet excited state is preferably greater than or equal to 0 eV and less than or equal to 0.2 eV, more preferably greater than or equal to 0 eV and less than or equal to 0.1 eV.

Note that although an effect of an increase in emission efficiency can be obtained as long as one of the light-emitting layers emits delayed fluorescence, it is more preferable that both of the light-emitting layers emit delayed fluorescence.

In the case of a light-emitting element in which delayed fluorescence is exhibited, the external quantum efficiency might exceed 5% (singlet excited state generation rate 25%×light extraction efficiency 20%), which is said to be the theoretical limit of a fluorescent element hardly exhibiting delayed fluorescence. When a light-emitting element having the structure of the light-emitting element of this embodiment has external quantum efficiency exceeding 5%, the light-emitting element can be assumed to exhibit delayed fluorescence efficiently.

In a different viewpoint, it can be said that delayed fluorescence is efficiently exhibited as long as the EL internal quantum efficiency $\Phi e1$ (=$\Phi p \times 25\%$ (singlet excited state generation rate in EL)) estimated from the PL quantum efficiency $\Phi p$ of the exciplex is lower than the internal quantum efficiency $\Phi e2$ (external quantum efficiency÷20% (light extraction efficiency)) of the light-emitting element. Note that $\Phi e2$ is preferably about twice as large as $\Phi e1$, in which case the use of the light-emitting element of this embodiment is more effective.

In the light-emitting element of this embodiment having the above-described structure, light with different wavelengths emitted from the first light-emitting layer and the second light-emitting layer is obtained from exciplexes, so that the light-emitting element can be a multicolor light-emitting element. The emission spectrum of such a light-emitting element has at least two peaks.

Further, although the first light-emitting layer and the second light-emitting layer are formed in contact with each other in the light-emitting element of this embodiment, energy transfer between the light-emitting layers is less likely to occur; thus, the balance between light emission from the first light-emitting layer and light emission from the second light-emitting layer can be easily adjusted.

For this reason, the light-emitting element can be suitably used as a light-emitting element exhibiting white light, in which control of an emission color is important. Thus, the light-emitting element can be effectively used as a light-emitting element for lighting.

Since the exciplexes are used in the light-emitting layers in the light-emitting element of this embodiment having the above-described structure, energy transfer between the light-emitting layers is less likely to occur, so that color adjustment of the light-emitting element can be easily made.

Moreover, in the light-emitting element of this embodiment, light emission obtained from the exciplexes is utilized, so that delayed fluorescence is easily exhibited. The use of the delayed fluorescence can convert the triplet excited energy into light emission; thus, the light-emitting element can have high emission efficiency.

Furthermore, the exciplexes are used in the light-emitting element of this embodiment, so that energy transfer between the light-emitting layers is less likely to occur and delayed fluorescence is easily obtained. Thus, color adjustment of the light-emitting element can be easily made, and the light-emitting element can have favorable emission efficiency.

Embodiment 2

In this embodiment, a detailed example of the structure of the light-emitting element described in Embodiment 1 is described below with reference to FIG. 1.

A light-emitting element in this embodiment includes, between a pair of electrodes, an EL layer including a plurality of layers. In this embodiment, the light-emitting element includes the first electrode 101, the second electrode 102, and the EL layer 103 provided between the first electrode 101 and the second electrode 102. Note that in this embodiment, the first electrode 101 functions as an anode and the second electrode 102 functions as a cathode. In other words, when voltage is applied between the first electrode 101 and the second electrode 102 so that the potential of the first electrode 101 is higher than that of the second electrode 102, light emission can be obtained.

Since the first electrode 101 functions as the anode, the first electrode 101 is preferably formed using any of metals, alloys, electrically conductive compounds with a high work function (specifically, a work function of 4.0 eV or more), mixtures thereof, and the like. Specific examples are indium oxide-tin oxide (ITO: indium tin oxide), indium oxide-tin oxide containing silicon or silicon oxide, indium oxide-zinc oxide, indium oxide containing tungsten oxide and zinc oxide (IWZO), and the like. Such conductive metal oxide films are usually formed by a sputtering method, but may also be formed by application of a sol-gel method or the like. In an example of the formation method, indium oxide-zinc oxide is deposited by a sputtering method using a target obtained by adding 1 wt % to 20 wt % of zinc oxide to indium oxide. Further, a film of indium oxide containing tungsten oxide and zinc oxide (IWZO) can be formed by a sputtering method using a target in which tungsten oxide and zinc oxide are added to indium oxide at 0.5 wt % to 5 wt % and 0.1 wt % to 1 wt %, respectively. In addition, gold (Au), platinum (Pt), nickel (Ni), tungsten (W), chromium (Cr), molybdenum (Mo), iron (Fe), cobalt (Co), copper (Cu), palladium (Pd), a nitride of a metal material (such as titanium nitride), or the like can be used. Graphene can also be used. Note that when a composite material described later is used for a layer which is in contact with the first electrode 101 in the EL layer 103, an electrode material can be selected regardless of its work function.

There is no particular limitation on the stacked structure of the EL layer 103 as long as the light-emitting layer 113 has the structure described in Embodiment 1. For example, the EL layer 103 can be formed by combining a hole-injection layer, a hole-transport layer, the light-emitting layer, an electron-transport layer, an electron-injection layer, a carrier-blocking layer, an intermediate layer, and the like as appropriate. In this embodiment, the EL layer 103 has a structure in which a hole-injection layer 111, a hole-transport layer 112, a light-emitting layer 113, an electron-transport layer 114, and an electron-injection layer 115 are stacked in this order over the first electrode 101. Materials for the layers are specifically given below.

The hole-injection layer 111 is a layer containing a substance having a high hole-injection property. Molybdenum oxide, vanadium oxide, ruthenium oxide, tungsten oxide, manganese oxide, or the like can be used. Alternatively, the hole-injection layer 111 can be formed using a phthalocyanine-based compound such as phthalocyanine (abbreviation: $H_2Pc$) or copper phthalocyanine (abbreviation: CuPc), an aromatic amine compound such as 4,4'-bis[N-(4-diphenylaminophenyl)-N-phenylamino]biphenyl (abbreviation: DPAB) or N,N'-bis{4-[bis(3-methylphenyeamino]phenyl}-N,N'-diphenyl-(1,1'-biphenyl)-4,4'-diamine (abbreviation: DNTPD), a high molecular compound such as poly(3,4-ethylenedioxythiophene)/poly(styrenesulfonic acid) (PEDOT/PSS), or the like.

Alternatively, a composite material in which a material having a hole-transport property contains a material having an acceptor property can be used for the hole-injection layer 111. Note that the use of such a substance having a hole-transport property which contains a substance having an acceptor property enables selection of a material used to form an electrode regardless of its work function. In other words, besides a material having a high work function, a material having a low work function can also be used for the first electrode 101. As the acceptor substance, 7,7,8,8-tetracyano-2,3,5,6-tetrafluoroquinodimethane (abbreviation: $F_4$-TCNQ), chloranil, and the like can be given. In addition, a transition metal oxide can be given. In addition, oxides of metals belonging to Group 4 to Group 8 of the periodic table can be given. Specifically, vanadium oxide, niobium oxide, tantalum oxide, chromium oxide, molybdenum oxide, tungsten oxide, manganese oxide, and rhenium oxide are preferable because of their high electron-accepting properties. Among these, molybdenum oxide is especially preferable because it is stable in the air, has a low hygroscopic property, and is easily handled.

As the material having a hole-transport property used for the composite material, any of a variety of organic compounds such as aromatic amine compounds, carbazole derivatives, aromatic hydrocarbons, and high molecular compounds (e.g., oligomers, dendrimers, or polymers) can be used. Note that the organic compound used for the composite material is preferably an organic compound having a high hole-transport property. Specifically, a substance having a hole mobility of $10^{-6}$ cm$^2$/Vs or higher is preferably used. Organic compounds which can be used as the material having a hole-transport property in the composite material are specifically given below.

Examples of the aromatic amine compound include N,N'-di(p-tolyl)-N,N'-diphenyl-p-phenylenediamine (abbreviation: DTDPPA), 4,4'-bis[N-(4-diphenylaminophenyl)-N-phenylamino]biphenyl (abbreviation: DPAB), N,N'-bis[4-[bis(3-methylphenyl)amino]phenyl]-N,N'-diphenyl-[1,1'-biphenyl]-4,4'-diamine (abbreviation: DNTPD), 1,3,5-tris[N-(4-diphenylaminophenyl)-N-phenylamino]benzene (abbreviation: DPA3B), and the like.

As carbazole derivatives which can be used for the composite material, the following can be given specifically: 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), and the like.

In addition, examples of the carbazole derivatives which can be used for the composite material include 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthryl)phenyl]-9H-carbazole (abbreviation: CzPA), 1,4-bis[4-(N-carbazolyl)phenyl]-2,3,5,6-tetraphenylbenzene, and the like.

Examples of the aromatic hydrocarbon which can be used for the composite material include 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 2-tert-butyl-9,10-bis[2-(1-naphthyl)phenyl]anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthypanthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, and 2,5,8,11-tetra(tert-butyl)perylene. Besides, pentacene, coronene, or the like can also be used. As these aromatic hydrocarbons given here, it is preferable that an aromatic hydrocarbon having a hole mobility of $1\times10^{-6}$ cm$^2$/Vs or more and having 14 to 42 carbon atoms be used.

The aromatic hydrocarbon which can be used for the composite material may have a vinyl skeleton. Examples of the aromatic hydrocarbon having a vinyl group include 4,4'-bis(2,2-diphenylvinyl)biphenyl (abbreviation: DPVBi), 9,10-bis[4-(2,2-diphenylvinyl)phenyl]anthracene (abbreviation: DPVPA), and the like.

Moreover, a high molecular compound such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N-phenylamino}phenyl) methacrylamide](abbreviation: PTPDMA), or poly[N,N'-bis(4-butylphenyl)-N,N'-bis(phenyl)benzidine (abbreviation: poly-TPD) can also be used.

By providing a hole-injection layer, a high hole-injection property can be achieved to allow a light-emitting element to be driven at a low voltage.

The hole-transport layer 112 is a layer containing a material having a hole-transport property. Examples of the material having a hole-transport property include aromatic amine compounds such as 4,4'-bis[N-(1-naphthyl)-N-phenylamino]biphenyl (abbreviation: NPB), N,N'-bis(3-methylphenyl)-N,N'-diphenyl-[1,1'-biphenyl]-4,4'-diamine (abbreviation: TPD), 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), 4,4'-bis[N-(Spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), and the like. The substances given here have high hole-transport properties and are mainly ones having a hole mobility of $10^{-6}$ cm$^2$/Vs or more. An organic compound given as an example of the material having a hole-transport property in the composite material described above can also be used for the hole-transport layer 112. Moreover, a high molecular compound such as poly(N-vinylcarbazole) (abbreviation: PVK) or poly(4-vinyltriphenylamine) (abbreviation: PVTPA) can also be used. Note that the layer containing a material having a hole-transport property is not limited to a single layer, and may be a stack of two or more layers containing any of the above materials.

The light-emitting layer 113 has the structure of the light-emitting layer 113, which is described in Embodiment 1. In other words, the first light-emitting layer 113a and the second light-emitting layer 113b are stacked in this order over the first electrode. The first light-emitting layer 113a contains a first organic compound and a second organic compound. The second light-emitting layer 113b contains a third organic compound and a fourth organic compound. The light-emitting element of this embodiment is characterized in that the combination of the first organic compound and the second organic compound forms a first exciplex and the combination of the third organic compound and the fourth organic compound forms a second exciplex. In addition, light emission is obtained from the first exciplex and the second exciplex.

There is no particular limitation on the materials which can be used as the first organic compound, the second organic compound, the third organic compound, and the fourth organic compound as long as the combination of the materials satisfies the conditions described in Embodiment 1. A variety of kinds of carrier-transport materials can be selected.

Examples of the material having an electron-transport property (material which easily accepts electrons) include a heterocyclic compound having a polyazole skeleton, such as bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), or bis[2-(2-benzothiazolyl)phenolato]zinc(II) (abbreviation: ZnBTZ); a heterocyclic compound having a polyazole skeleton such as 2-(4-biphenylyl)-5-(4-tert-butylphenyl)-1,3,4-oxadiazole (abbreviation: PBD), 3-(4-biphenylyl)-4-phenyl-5-(4-tert-butylphenyl)-1,2,4-triazole (abbreviation: TAZ), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)

phenyl]-9H-carbazole (abbreviation: CO11), 2,2',2"-(1,3,5-benzenetriyptris(1-phenyl-1H-benzimidazole) (abbreviation: TPBI), or 2-[3-(dibenzothiophen-4-yl)phenyl]-1-phenyl-1H-benzimidazole (abbreviation: mDBT-BIm-II); a heterocyclic compound having a diazine skeleton, such as 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[3'-(9H-carbazol-9-yl)biphenyl-3-yl]dibenzo[f,h]quinoxaline (abbreviation: 2mCzBPDBq), 4,6-bis[3-(phenanthren-9-yl)phenyl]pyrimidine (abbreviation: 4,6mPnP2Pm), or 4,6-bis[3-(4-dibenzothienyl)phenyl]pyrimidine (abbreviation: 4,6mDBTP2Pm-II); and a heterocyclic compound having a pyridine skeleton, such as 2-[3'-(dibenzothiophen-4-yl)biphenyl-3-yl]dibenzo[f,h]quinoline (abbreviation: 2mDBTBPDBQu-II), 3,5-bis[3-(9H-carbazol-9-yl)phenyl]pyridine (abbreviation: 35DCzPPy), or 1,3,5-tri[3-(3-pyridyl)phenyl]benzene (abbreviation: TmPyPB). Among the above materials, a heterocyclic compound having a diazine skeleton and a heterocyclic compound having a pyridine skeleton have high reliability and are thus preferable. Specifically, a heterocyclic compound having a diazine (pyrimidine or pyrazine) skeleton has a high electron-transport property to contribute to a reduction in drive voltage.

Examples of the material having a hole-transport property (material which easily accepts holes) include a compound having an aromatic amine skeleton, such as 4,4'-bis[N-(1-naphthyl)-N-phenylamino]biphenyl (abbreviation: NPB), N,N'-bis(3-methylphenyl)-N,N'-diphenyl-[1,1'-biphenyl]-4,4'-diamine (abbreviation: TPD), 4,4'-bis[N-(Spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-(9-phenyl-9H-carbazol-3-yl)triphenylamine (abbreviation: PCBA1BP), 4,4'-diphenyl-4"-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), 9,9-dimethyl-N-phenyl-N-[4-(9-phenyl-9H-carbazol-3-yl)phenyl]fluoren-2-amine (abbreviation: PCBAF), or N-phenyl-N-[4-(9-phenyl-9H-carbazol-3-yl)phenyl]spiro-9,9'-bifluoren-2-amine (abbreviation: PCBASF); a compound having a carbazole skeleton, such as 1,3-bis(N-carbazolyl)benzene (abbreviation: mCP), 4,4'-di(N-carbazolyl)biphenyl (abbreviation: CBP), 3,6-bis(3,5-diphenylphenyl)-9-phenylcarbazole (abbreviation: CzTP), or 3,3'-bis(9-phenyl-9H-carbazole) (abbreviation: PCCP); a compound having a thiophene skeleton such as 4,4',4"-(benzene-1,3,5-triyl)tri(dibenzothiophene) (abbreviation: DBT3P-II), 2,8-diphenyl-4-[4-(9-phenyl-9H-fluoren-9-yl)phenyl]dibenzothiophene (abbreviation: DBTFLP-III), or 4-[4-(9-phenyl-9H-fluoren-9-yl)phenyl]-6-phenyldibenzothiophene (abbreviation: DBTFLP-IV); and a compound having a furan skeleton, such as 4,4',4"-(benzene-1,3,5-triyl)tri(dibenzofuran) (abbreviation: DBF3P-II) or 4-{3-[3-(9-phenyl-9H-fluoren-9-yl)phenyl]phenyl}dibenzofuran (abbreviation: mmDBFFLBi-II). Among the above materials, a compound having an aromatic amine skeleton and a compound having a carbazole skeleton are preferable because these compounds are highly reliable and have high hole-transport properties to contribute to a reduction in drive voltage.

Carrier-transport materials can be selected from known substances as well as from the carrier-transport materials given above. An exciplex to be formed exhibits light emission originating from a difference in energy between the shallower HOMO level of the HOMO levels of the two compounds to be combined and the deeper LUMO level of the LUMO levels of the two compounds to be combined; thus, the combination of the first organic compound and the second organic compound and the combination of the third organic compound and the fourth organic compound with which light emission with a desired wavelength can be achieved is selected. Note that one of the first organic compound and the second organic compound may be the same as one of the third organic compound and the fourth organic compound. In this case, fewer kinds of materials for forming the light-emitting element can be used, so that the light-emitting element is advantageous in terms of cost.

Further, the combination of a material having an electron-transport property as one organic compound and a material having a hole-transport property as the other organic compound is advantageous for the formation of an exciplex. The transport property of the light-emitting layer can be easily adjusted and a recombination region can be easily adjusted by changing the contained amount of each compound. The ratio of the contained amount of the material having an electron-transport property to contained amount of the material having an electron-transport property may be 1:9 to 9:1.

The light-emitting layer 113 having the above-described structure can be formed by co-evaporation by a vacuum evaporation method, or an inkjet method, a spin coating method, a dip coating method, or the like using a mixed solution.

Note that although the structure in which the first light-emitting layer 113a is formed on the anode side and the second light-emitting layer 113b is formed on the cathode side is described in this embodiment, the stacking order may be reversed. In other words, the second light-emitting layer 113b may be formed on the anode side and the first light-emitting layer 113a may be formed on the cathode side.

The other structure and effect of the light-emitting layer 113 are the same as those described in Embodiment 1. Embodiment 1 is to be referred to.

The electron-transport layer 114 is a layer containing a material having an electron-transport property. Example of the electron-transport layer 114 is a layer containing a metal complex having a quinoline skeleton or a benzoquinoline skeleton, such as tris(8-quinolinolato)aluminum (abbreviation: Alq), tris(4-methyl-8-quinolinolato)aluminum (abbreviation: Almq$_3$), bis(10-hydroxybenzo[h]quinolinato)beryllium (abbreviation: BeBq$_2$), or bis(2-methyl-8-quinolinolato)(4-phenylphenolato)aluminum (abbreviation: BAlq), or the like. Alternatively, a metal complex having an oxazole-based or thiazole-based ligand, such as bis[2-(2-hydroxyphenyl)benzoxazolato]zinc (abbreviation: Zn(BOX)$_2$) or bis[2-(2-hydroxyphenyl)benzothiazolato]zinc (abbreviation: Zn(BTZ)$_2$), or the like can be used. Other than the metal complexes, 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), bathophenanthroline (abbreviation: BPhen), bathocuproine (abbreviation: BCP), or the like can be used. The substances given here have high electron-transport properties and are mainly ones having an electron mobility of $10^{-6}$ cm$^2$/Vs or more. Note that any of the above-described host materials having electron-transport properties may be used for the electron-transport layer 114.

The electron-transport layer 114 is not limited to a single layer and may be a stack of two or more layers containing any of the substances given above.

Further, a layer for controlling transport of electron carriers may be provided between the electron-transport layer and the light-emitting layer. This is a layer formed by addition of a small amount of a substance having a high electron-trapping property to the aforementioned materials having a high electron-transport property, and the layer is capable of adjusting carrier balance by retarding transport of electron carriers. Such a structure is very effective in preventing a problem (such as a reduction in element lifetime) caused when electrons pass through the light-emitting layer.

In addition, an electron-injection layer 115 may be provided in contact with the second electrode 102 between the electron-transport layer 114 and the second electrode 102. For the electron-injection layer 115, an alkali metal, an alkaline earth metal, or a compound thereof, such as lithium fluoride (LiF), cesium fluoride (CsF), or calcium fluoride ($CaF_2$), can be used. For example, a layer that is formed using a substance having an electron-transport property and contains an alkali metal, an alkaline earth metal, or a compound thereof can be used. Note that a layer that is formed using a substance having an electron-transport property and contains an alkali metal or an alkaline earth metal is preferably used as the electron-injection layer 115, in which case electron injection from the second electrode 102 is efficiently performed.

For the second electrode 102, any of metals, alloys, electrically conductive compounds, and mixtures thereof which have a low work function (specifically, a work function of 3.8 eV or less) or the like can be used. Specific examples of such a cathode material are elements belonging to Groups 1 and 2 of the periodic table, such as alkali metals (e.g., lithium (Li) and cesium (Cs)), magnesium (Mg), calcium (Ca), and strontium (Sr), alloys thereof (e.g., MgAg and AlLi), rare earth metals such as europium (Eu) and ytterbium (Yb), alloys thereof, and the like. However, when the electron-injection layer is provided between the second electrode 102 and the electron-transport layer, for the second electrode 102, any of a variety of conductive materials such as Al, Ag, ITO, or indium oxide-tin oxide containing silicon or silicon oxide can be used regardless of the work function. Films of these electrically conductive materials can be formed by a sputtering method, an inkjet method, a spin coating method, or the like.

Any of a variety of methods can be used to form the EL layer 103 regardless whether it is a dry process or a wet process. For example, a vacuum evaporation method, an ink-jet method, a spin coating method or the like may be used. A different formation method may be employed for each electrode or each layer.

In addition, the electrode may be formed by a wet method using a sol-gel method, or by a wet method using paste of a metal material. Alternatively, the electrode may be formed by a dry method such as a sputtering method or a vacuum evaporation method.

In the light-emitting element having the above-described structure, current flows due to a potential difference between the first electrode 101 and the second electrode 102, and holes and electrons recombine in the light-emitting layer 113 which contains a substance with a high light-emitting property, so that light is emitted. That is, a light-emitting region informed in the light-emitting layer 113.

Light emission is extracted out through one or both of the first electrode 101 and the second electrode 102. Therefore, one or both of the first electrode 101 and the second electrode 102 are light-transmitting electrodes. In the case where only the first electrode 101 is a light-transmitting electrode, light emission is extracted through the first electrode 101. In the case where only the second electrode 102 is a light-transmitting electrode, light emission is extracted through the second electrode 102. In the case where both the first electrode 101 and the second electrode 102 are light-transmitting electrodes, light emission is extracted through the first electrode 101 and the second electrode 102.

The structure of the layers provided between the first electrode 101 and the second electrode 102 is not limited to the above-described structure. Preferably, a light-emitting region where holes and electrons recombine is positioned away from the first electrode 101 and the second electrode 102 so that quenching due to the proximity of the light-emitting region and a metal used for electrodes and carrier-injection layers can be prevented.

Further, in order that transfer of energy from an exciton generated in the light-emitting layer can be suppressed, preferably, the hole-transport layer and the electron-transport layer which are in contact with the light-emitting layer 113, particularly a carrier-transport layer in contact with a side closer to the light-emitting region in the light-emitting layer 113, are formed using a substance having a wider band gap than the exciplex included in the light-emitting layer.

A light-emitting element in this embodiment is preferably fabricated over a substrate of glass, plastic, or the like. As the way of stacking layers over the substrate, layers may be sequentially stacked from the first electrode 101 side or sequentially stacked from the second electrode 102 side. In a light-emitting device, although one light-emitting element may be formed over one substrate, a plurality of light-emitting elements may be formed over one substrate. With a plurality of light-emitting elements as described above formed over one substrate, a lighting device in which elements are separated or a passive-matrix light-emitting device can be manufactured. A light-emitting element may be formed over an electrode electrically connected to a thin film transistor (TFT), for example, which is formed over a substrate of glass, plastic, or the like, so that an active matrix light-emitting device in which the TFT controls the drive of the light-emitting element can be manufactured. Note that there is no particular limitation on the structure of the TFT, which may be a staggered TFT or an inverted staggered TFT. In addition, crystallinity of a semiconductor used for the TFT is not particularly limited either; an amorphous semiconductor or a crystalline semiconductor may be used. In addition, a driver circuit formed in a TFT substrate may be formed with an n-type TFT and a p-type TFT, or with either an n-type TFT or a p-type TFT.

Note that this embodiment can be combined with any of the other embodiments as appropriate.

Embodiment 3

In this embodiment, a light-emitting device including the light-emitting element described in Embodiments 1 and 2 is described.

Figure 2A:
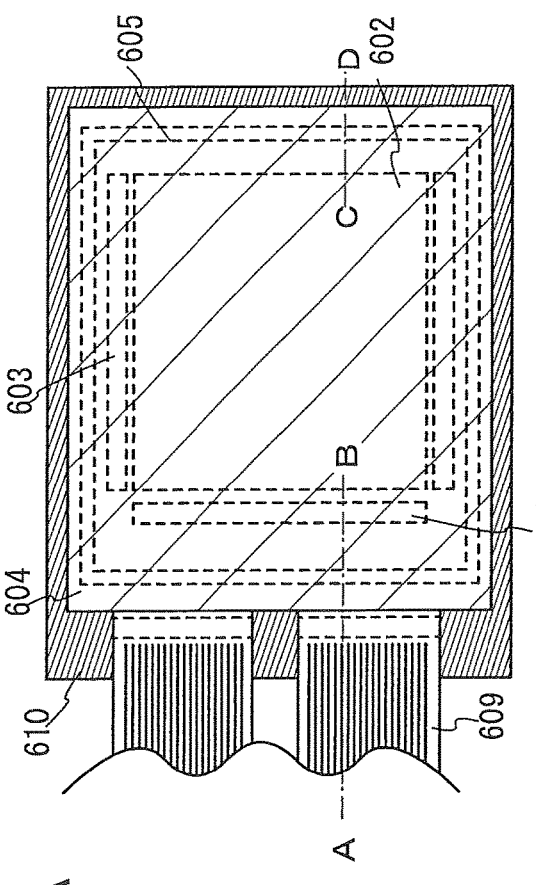
FIGS. 2A and 2B are conceptual diagrams of an active matrix light-emitting device.
Figure 2B:
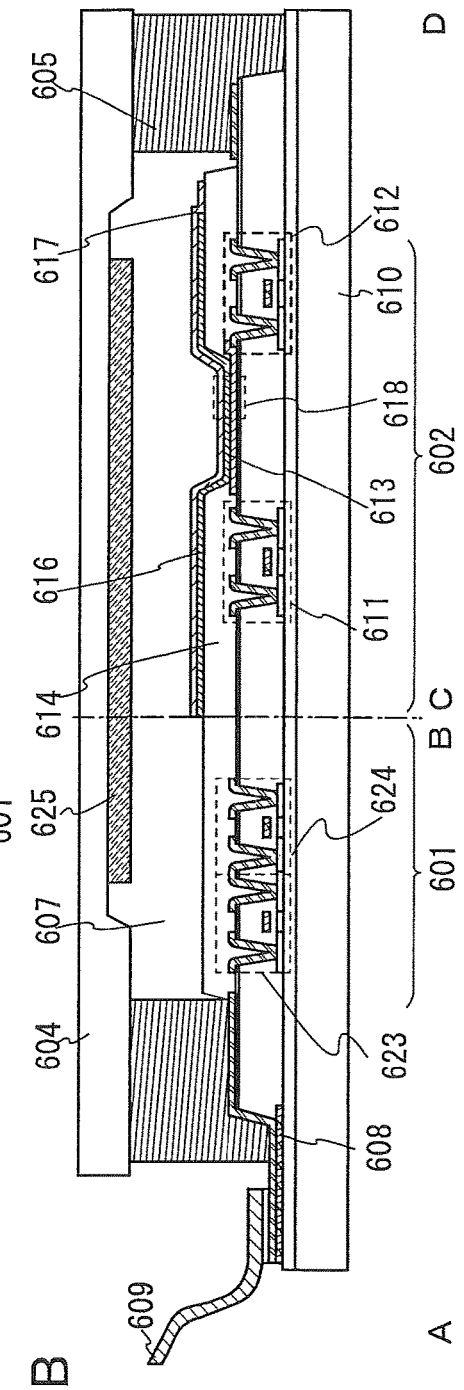

In this embodiment, the light-emitting device manufactured using the light-emitting element described in Embodiments 1 and 2 is described with reference to FIGS. 2A and 2B. Note that FIG. 2A is a top view illustrating the light-emitting device and FIG. 2B is a cross-sectional view of FIG. 2A taken along lines A-B and C-D. The light-emitting device includes a driver circuit portion (source line driver circuit) 601, a pixel portion 602, and a driver circuit portion (gate line driver circuit) 603, which are to control light emission of the light-emitting element and illustrated with dotted lines. Moreover, a reference numeral 604 denotes a sealing substrate; 605, a sealing material; and 607, a space surrounded by the sealing material 605.

Note that a lead wiring 608 is a wiring for transmitting signals to be input to the source line driver circuit 601 and the gate line driver circuit 603 and for receiving a video signal, a clock signal, a start signal, a reset signal, and the like from an FPC (flexible printed circuit) 609 serving as an external input terminal. Although only the FPC is illustrated here, a printed wiring board (PWB) may be attached to the FPC. The light-emitting device in the present specification includes, in its category, not only the light-emitting device itself but also the light-emitting device provided with the FPC or the PWB.

Next, a cross-sectional structure is described with reference to FIG. 2B. The driver circuit portion and the pixel portion are formed over an element substrate 610; the source line driver circuit 601, which is a driver circuit portion, and one of the pixels in the pixel portion 602 are illustrated here.

In the source line driver circuit 601, a CMOS circuit is formed in which an n-channel TFT 623 and a p-channel TFT 624 are combined. In addition, the driver circuit may be formed with any of a variety of circuits such as a CMOS circuit, a PMOS circuit, or an NMOS circuit. Although a driver-integrated type in which the driver circuit is formed over the substrate is described in this embodiment, the present invention is not limited to this type and the driver circuit can be formed outside the substrate.

The pixel portion 602 is formed with a plurality of pixels including a switching TFT 611, a current controlling TFT 612, and a first electrode 613 connected electrically with a drain of the current controlling TFT. An insulator 614 is formed to cover the end portions of the first electrode 613. Here, the insulator 614 is formed using a positive type photosensitive acrylic resin film.

In order to improve the coverage, the insulator 614 is formed to have a curved surface with curvature at its upper or lower end portion. For example, in the case where positive photosensitive acrylic is used for a material of the insulator 614, only the upper end portion of the insulator 614 preferably has a curved surface with a curvature radius (0.2 µm to 3 µm). As the insulator 614, either a negative photosensitive resin or a positive photosensitive resin can be used.

An EL layer 616 and a second electrode 617 are formed over the first electrode 613. As a material used for the first electrode 613 functioning as an anode, a material having a high work function is preferably used. For example, a single-layer film of an ITO film, an indium tin oxide film containing silicon, an indium oxide film containing zinc oxide at 2 wt % to 20 wt %, a titanium nitride film, a chromium film, a tungsten film, a Zn film, a Pt film, or the like, a stack of a titanium nitride film and a film containing aluminum as its main component, a stack of three layers of a titanium nitride film, a film containing aluminum as its main component, and a titanium nitride film, or the like can be used. The stacked-layer structure enables low wiring resistance, favorable ohmic contact, and a function as an anode.

In addition, the EL layer 616 is formed by any of a variety of methods such as an evaporation method using an evaporation mask, an inkjet method, and a spin coating method. The EL layer 616 has the structure described in Embodiments 1 and 2. Further, for another material included in the EL layer 616, any of low molecular-weight compounds and polymeric compounds (including oligomers and dendrimers) may be used.

As a material used for the second electrode 617, which is formed over the EL layer 616 and functions as a cathode, a material having a low work function (e.g., Al, Mg, Li, Ca, or an alloy or a compound thereof, such as MgAg, MgIn, or AlLi) is preferably used. In the case where light generated in the EL layer 616 is transmitted through the second electrode 617, a stack of a thin metal film and a transparent conductive film (e.g., ITO, indium oxide containing zinc oxide at 2 wt % to 20 wt %, indium tin oxide containing silicon, or zinc oxide (ZnO)) is preferably used for the second electrode 617.

Note that the light-emitting element is formed with the first electrode 613, the EL layer 616, and the second electrode 617. The light-emitting element has the structure described in Embodiment 1 or 2. In the light-emitting device of this embodiment, the pixel portion, which includes a plurality of light-emitting elements, may include both the light-emitting element described in Embodiment 1 or 2 and a light-emitting element having a different structure.

Further, the sealing substrate 604 is attached to the element substrate 610 with the sealing material 605, so that the light-emitting element 618 is provided in the space 607 surrounded by the element substrate 610, the sealing substrate 604, and the sealing material 605. The space 607 may be filled with filler, or may be filled with an inert gas (such as nitrogen or argon), or the sealing material 605. It is preferable that the sealing substrate be provided with a recessed portion and the desiccant 625 be provided in the recessed portion, in which case deterioration due to influence of moisture can be suppressed.

An epoxy-based resin or glass frit is preferably used for the sealing material 605. It is preferable that such a material do not transmit moisture or oxygen as much as possible. As the sealing substrate 604, a glass substrate, a quartz substrate, or a plastic substrate formed of fiberglass reinforced plastic (FRP), polyvinyl fluoride (PVF), polyester, acrylic, or the like can be used.

As described above, the light-emitting device which uses the light-emitting element described in Embodiment 1 or 2 can be obtained.

The light-emitting device in this embodiment is fabricated using the light-emitting element described in Embodiment 1 or 2 and thus can have favorable characteristics. Specifically, since the light-emitting element described in Embodiment 1 or 2 has favorable emission efficiency, the light-emitting device can have reduced power consumption. In addition, since the light-emitting element described in Embodiment 1 or 2 is easily manufactured, the light-emitting device can be provided at low cost.

FIGS. 3A and 3B each illustrate an example of a light-emitting device in which full color display is achieved by formation of a light-emitting element exhibiting white light emission and with the use of coloring layers (color filters) and the like. In FIG. 3A, a substrate 1001, a base insulating film 1002, a gate insulating film 1003, gate electrodes 1006, 1007, and 1008, a first interlayer insulating film 1020, a second interlayer insulating film 1021, a peripheral portion 1042, a pixel portion 1040, a driver circuit portion 1041, first electrodes 1024W, 1024R, 1024G and 1024B of light-emitting elements, a partition 1025, an EL layer 1028, a second electrode 1029 of the light-emitting elements, a sealing substrate 1031, a sealing material 1032, and the like are illustrated.

In FIG. 3A, coloring layers (a red coloring layer 1034R, a green coloring layer 1034G; and a blue coloring layer 1034B) are provided on a transparent base material 1033. A black layer (a black matrix) 1035 may be additionally provided. The transparent base material 1033 provided with the coloring layers and the black layer is positioned and fixed to the substrate 1001. Note that the coloring layers and the black layer are covered with an overcoat layer 1036. In FIG. 3A, light emitted from part of the light-emitting layer does not pass through the coloring layers, while light emitted from the other part of the light-emitting layer passes through the coloring layers. Since light which does not pass through the coloring layers is white and light which passes through any one of the coloring layers is red, blue, or green, an image can be displayed using pixels of the four colors.

FIG. 3B illustrates an example in which the coloring layers (the red coloring layer 1034R, the green coloring layer 1034G, and the blue coloring layer 1034B) are provided between the gate insulating film 1003 and the first interlayer insulating film 1020. As in the structure, the coloring layers may be provided between the substrate 1001 and the sealing substrate 1031.

Figure 4:
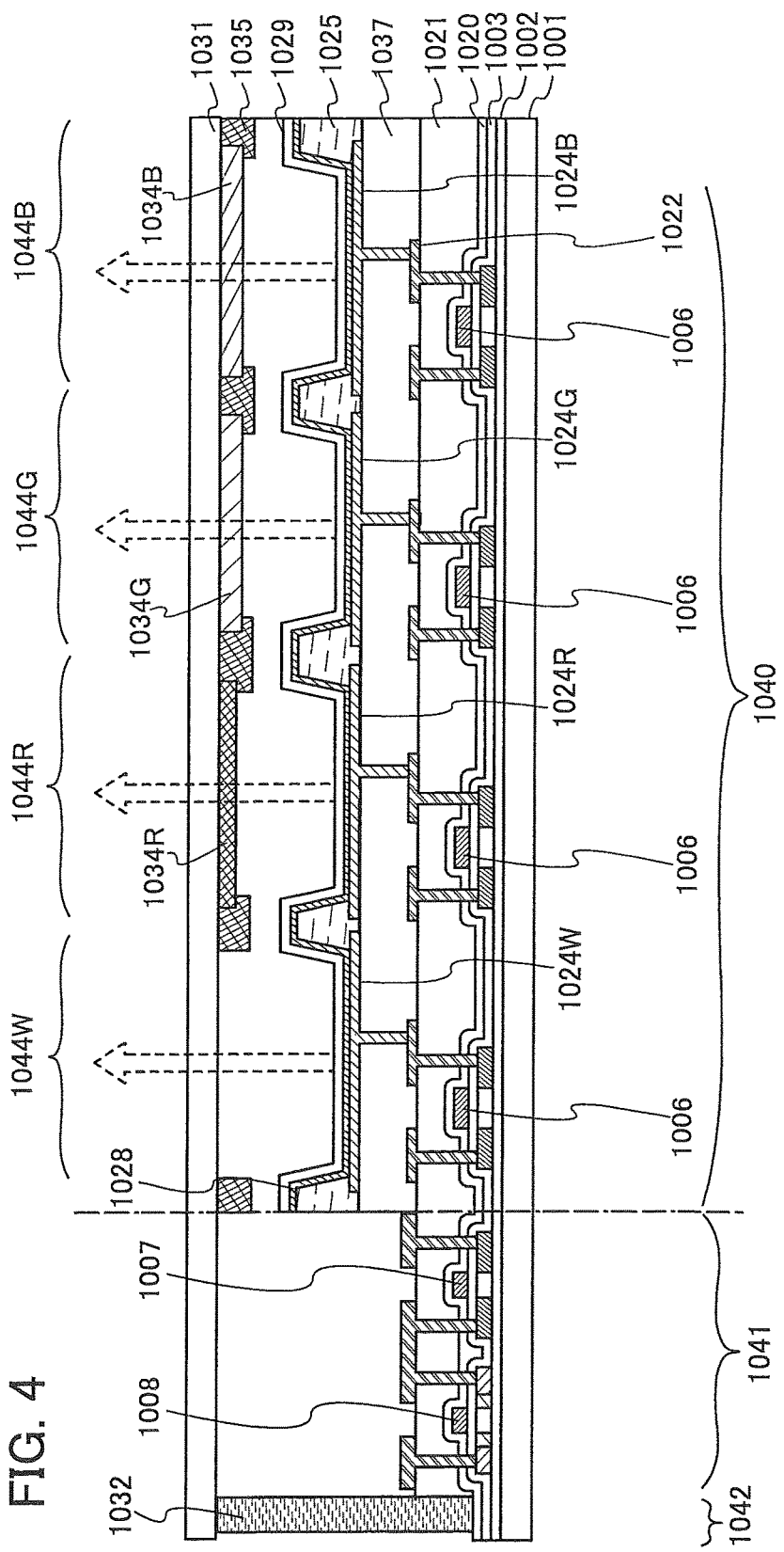
FIG. 4 is a conceptual diagram of an active matrix light-emitting device.

The above-described light-emitting device is a light-emitting device having a structure in which light is extracted from the substrate 1001 side where the TFTs are formed (a bottom emission structure), but may be a light-emitting device having a structure in which light is extracted from the sealing substrate 1031 side (a top emission structure). FIG. 4 is a cross-sectional view of a light-emitting device having a top emission structure. In this case, a substrate which does not transmit light can be used as the substrate 1001. The process up to the step of forming of a connection electrode which connects the TFT and the anode of the light-emitting element is performed in a manner similar to that of the light-emitting device having a bottom emission structure. Then, a third interlayer insulating film 1037 is formed to cover an electrode 1022. This insulating film may have a planarization function. The third interlayer insulating film 1037 can be formed using a material similar to that of the second interlayer insulating film, and can alternatively be formed using any other known material.

The first electrodes 1024W, 1024R, 1024G and 1024B of the light-emitting elements each function as an anode here, but may function as a cathode. Further, in the case of a light-emitting device having a top emission structure as illustrated in FIG. 4, the first electrodes are preferably reflective electrodes. The EL layer 1028 is formed to have a structure similar to the structure of the EL layer 103, which is described in Embodiment 1 or 2, with which white light emission can be obtained.

In the case of a top emission structure as illustrated in FIG. 4, sealing can be performed with the sealing substrate 1031 on which the coloring layers (the red coloring layer 1034R, the green coloring layer 1034G, and the blue coloring layer 1034B) are provided. The sealing substrate 1031 may be provided with the black layer (the black matrix) 1035 which is positioned between pixels. The coloring layers (the red coloring layer 1034R, the green coloring layer 1034G, and the blue coloring layer 1034B) and the black layer (the black matrix) may be covered with the overcoat layer 1036. Note that a light-transmitting substrate is used as the sealing substrate 1031.

Further, although an example in which full color display is performed using four colors of red, green, blue, and white is shown here, there is no particular limitation and full color display using three colors of red, green, and blue may be performed.

The light-emitting device in this embodiment is manufactured using the light-emitting element described in Embodiment 1 or 2 and thus can have favorable characteristics. Specifically, since the light-emitting element described in Embodiment 1 or 2 has favorable emission efficiency, the light-emitting device can have reduced power consumption. In addition, since the light-emitting element described in Embodiments 1 or 2 is easily manufactured, the light-emitting device can be provided at low cost.

Figure 5A:
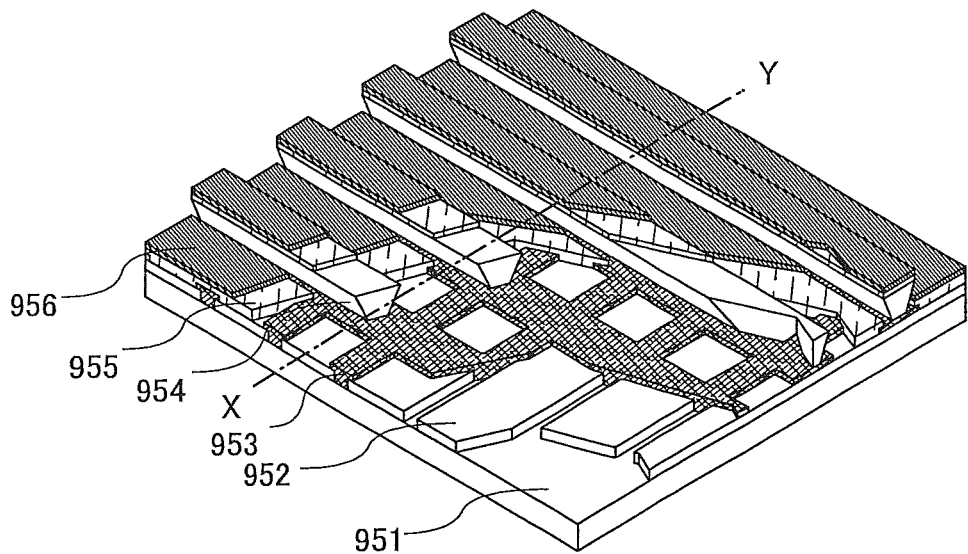
FIGS. 5A and 5B are conceptual diagrams of an active matrix light-emitting device.
Figure 5B:
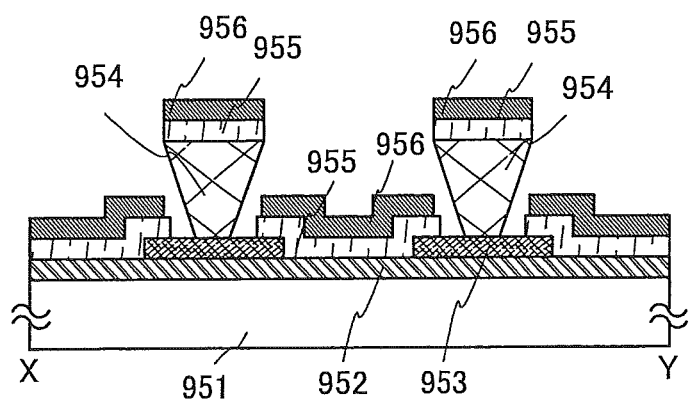

An active matrix light-emitting device is described above, whereas a passive matrix light-emitting device is described below. FIGS. 5A and 5B illustrate a passive matrix light-emitting device manufactured using the present invention. FIG. 5A is a perspective view of the light-emitting device, and FIG. 5B is a cross-sectional view of FIG. 5A taken along line X-Y. In FIGS. 5A and 5B, an EL layer 955 is provided between an electrode 952 and an electrode 956 over a substrate 951. An end portion of the electrode 952 is covered with an insulating layer 953. A partition layer 954 is provided over the insulating layer 953. The sidewalls of the partition layer 954 are aslope such that the distance between both sidewalls is gradually narrowed toward the surface of the substrate. In other words, a cross section taken along the direction of the short side of the partition wall layer 954 is trapezoidal, and the lower side (a side which is in the same direction as a plane direction of the insulating layer 953 and in contact with the insulating layer 953) is shorter than the upper side (a side which is in the same direction as the plane direction of the insulating layer 953 and not in contact with the insulating layer 953. The partition layer 954 thus provided can prevent defects in the light-emitting element due to static electricity or the like. Further, also in the passive matrix light-emitting device, the light-emitting element described in Embodiment 1 or 2, which has favorable emission efficiency, is used, so that the light-emitting device can have less power consumption. Moreover, since the light-emitting element described in Embodiment 1 or 2 is easily manufactured, the light-emitting device can be provided at low cost.

Since many minute light-emitting elements arranged in a matrix in the light-emitting device described above can each be controlled, the light-emitting device can be suitably used as a display device for displaying images.

This embodiment can be freely combined with any of other embodiments.

Embodiment 4

Figure 6A:
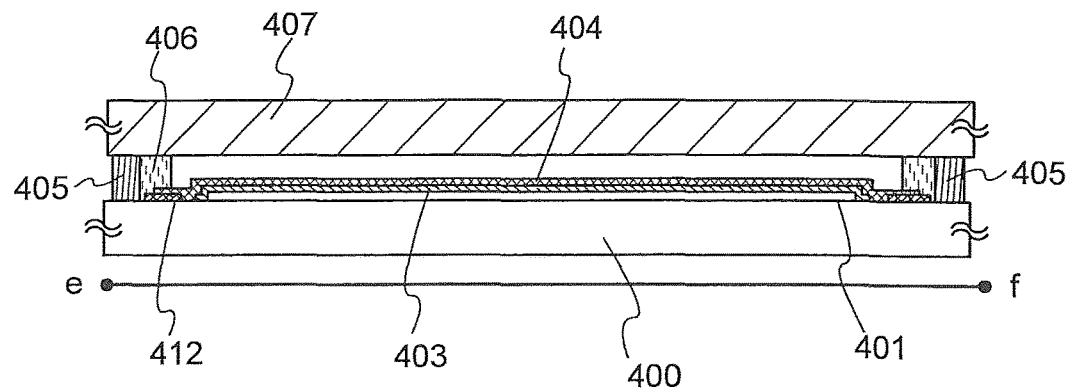
FIGS. 6A and 6B are conceptual diagrams of a lighting device.
Figure 6B:
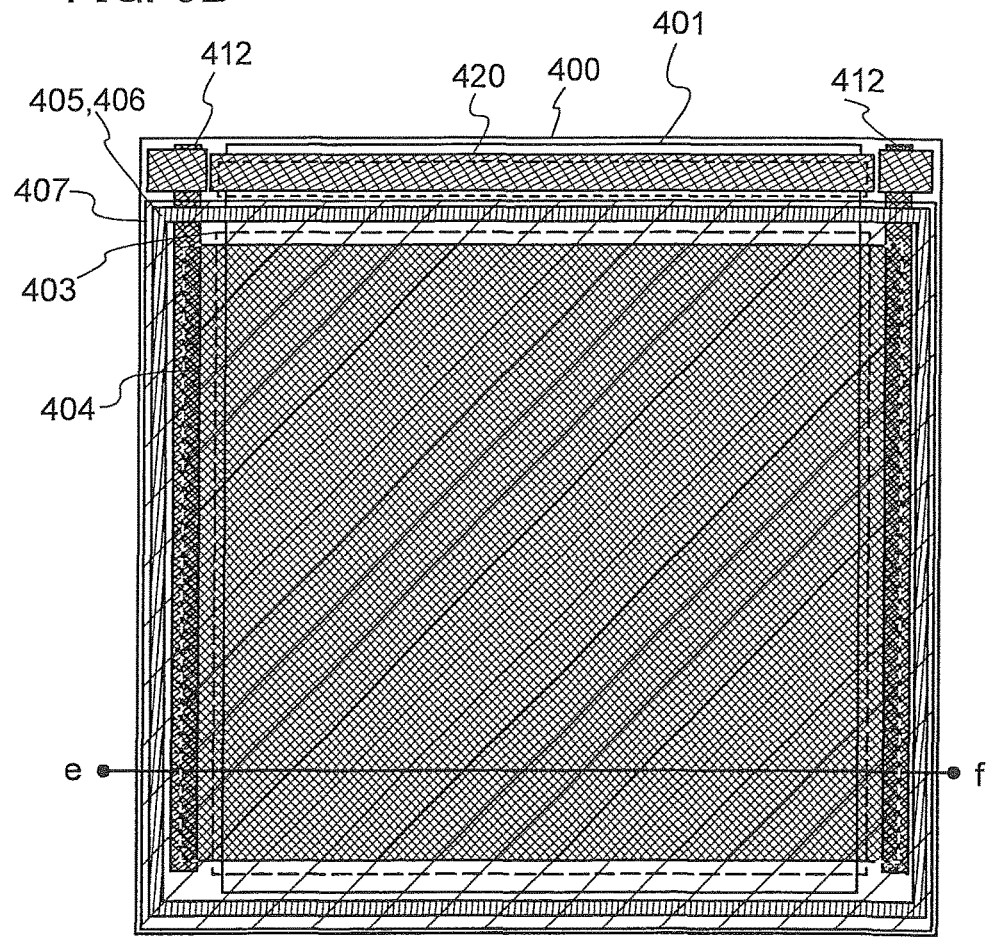

In this embodiment, an example in which the light-emitting element described in Embodiment 1 or 2 is used for a lighting device is described with reference to FIGS. 6A and 6B. FIG. 6B is a top view of the lighting device, and FIG. 6A is a cross-sectional view of FIG. 6A taken along line e-f.

In the lighting device in this embodiment, a first electrode 401 is formed over a substrate 400 which is a support and has a light-transmitting property. The first electrode 401 corresponds to the first electrode 101 in Embodiment 1. When light is extracted through the first electrode 401 side, the first electrode 401 is formed using a material having a light-transmitting property.

A pad 412 for applying voltage to a second electrode 404 is provided over the substrate 400.

An EL layer 403 is formed over the first electrode 401. The structure of the EL layer 403 corresponds to, for example, the structure of the EL layer 103 in Embodiment 1. For these structures, the description in Embodiment 1 can be referred to.

The second electrode 404 is formed to cover the EL layer 403. The second electrode 404 corresponds to the second electrode 102 in Embodiment 1. The second electrode 404 is formed using a material having high reflectance when light is extracted through the first electrode 401 side. The second electrode 404 is connected to the pad 412, whereby voltage is applied thereto.

As described above, the lighting device described in this embodiment includes a light-emitting element including the first electrode 401, the EL layer 403, and the second electrode 404. Since the light-emitting element has high emission efficiency, the lighting device in this embodiment can be a lighting device having low power consumption. In addition, since the light-emitting element described in Embodiment 1 and 2 is easily manufactured, the lighting device can be provided at low cost.

The light-emitting element having the above structure is fixed to a sealing substrate 407 with sealing materials 405 and 406 and sealing is performed, whereby the lighting device is completed. It is possible to use only either the sealing material 405 or the sealing material 406. In addition, the inner sealing material 406 (not shown in FIG. 6B) can be mixed with a desiccant which enables moisture to be adsorbed, increasing reliability.

When parts of the pad 412 and the first electrode 401 are extended to the outside of the sealing materials 405 and 406, the extended parts can serve as external input terminals. An IC chip 420 mounted with a converter or the like may be provided over the external input terminals.

As described above, since the lighting device described in this embodiment includes the light-emitting element described in Embodiment 1 or 2 as an EL element, the lighting device can be a lighting device having low power consumption. Further, the lighting device can be a lighting device driven at low voltage. Moreover, since the light-emitting element described in Embodiment 1 or 2 is easily manufactured, the light-emitting device can be provided at low cost.

Embodiment 5

In this embodiment, examples of electronic appliances each including the light-emitting element described in Embodiment 1 or 2 are described. The light-emitting element described in Embodiment 1 or 2 has favorable emission efficiency and reduced power consumption. As a result, the electronic appliances described in this embodiment can each include a light-emitting portion having reduced power consumption. In addition, since the light-emitting element described in Embodiment 1 or 2 is easily manufactured, the electronic appliance can be provided at low cost.

Examples of the electronic appliance to which the above light-emitting element is applied include television devices (also referred to as TV or television receivers), monitors for computers and the like, cameras such as digital cameras and digital video cameras, digital photo frames, mobile phones (also referred to as cell phones or mobile phone devices), portable game machines, portable information terminals, audio playback devices, large game machines such as pachinko machines, and the like. Specific examples of these electronic appliances are described below.

FIG. 7A illustrates an example of a television device. In the television device, a display portion 7103 is incorporated in a housing 7101. Here, the housing 7101 is supported by a stand 7105. Images can be displayed on the display portion 7103, and in the display portion 7103, the light-emitting elements described in Embodiment 1 and 2 are arranged in a matrix. The light-emitting elements can have favorable emission efficiency. Further, the light-emitting elements can be driven at low voltage. Moreover, the light-emitting elements can have a long lifetime. Therefore, the television device including the display portion 7103 which is formed using the light-emitting element can have reduced power consumption. Further, the television device can be driven at low voltage. Moreover, the television device can be inexpensive.

The television device can be operated with an operation switch of the housing 7101 or a separate remote controller 7110. With operation keys 7109 of the remote controller 7110, channels and volume can be controlled and images displayed on the display portion 7103 can be controlled. Further, the remote controller 7110 may be provided with a display portion 7107 for displaying data output from the remote controller 7110.

Note that the television device is provided with a receiver, a modem, and the like. With the use of the receiver, general television broadcasting can be received. Moreover, when the television set is connected to a communication network with or without wires via the modem, one-way (from a sender to a receiver) or two-way (between a sender and a receiver or between receivers) information communication can be performed.

FIG. 7B1 illustrates a computer, which includes a main body 7201, a housing 7202, a display portion 7203, a keyboard 7204, an external connection port 7205, a pointing device 7206, and the like. Note that this computer is manufactured using light-emitting elements arranged in a matrix in the display portion 7203, which are the same as that described in Embodiment 1 or 2. The computer illustrated in FIG. 7B1 may have a structure illustrated in FIG. 7B2. The computer illustrated in FIG. 7B2 is provided with a second display portion 7210 instead of the keyboard 7204 and the pointing device 7206. The second display portion 7210 is a touch screen, and input can be performed by operation of display for input on the second display portion 7210 with a finger or a dedicated pen. The second display portion 7210 can also display images other than the display for input. The display portion 7203 may also be a touchscreen. Connecting the two screens with a hinge can prevent troubles; for example, the screens can be prevented from being cracked or broken while the computer is being stored or carried. Note that this computer is manufactured using light-emitting elements arranged in a matrix in the display portion 7203, which are the same as that described in Embodiment 1 and 2. The light-emitting elements can have favorable emission efficiency. Therefore, this computer having the display portion 7203 which is formed using the light-emitting elements consumes less power. In addition, the computer can be inexpensive.

FIG. 7C illustrates a portable game machine, which includes two housings, a housing 7301 and a housing 7302, which are connected with a joint portion 7303 so that the portable game machine can be opened or folded. The housing 7301 incorporates a display portion 7304 including the light-emitting elements each of which is described in Embodiment 1 and 2 and which are arranged in a matrix, and the housing 7302 incorporates a display portion 7305. In addition, the portable game machine illustrated in FIG. 7C includes a speaker portion 7306, a recording medium insertion portion 7307, an LED lamp 7308, an input means (an operation key 7309, a connection terminal 7310, a sensor 7311 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), and a microphone 7312), and the like. Needless to say, the structure of the portable game machine is not limited to the above as long as the display portion including the light-emitting elements each of which is described in Embodiment 1 and 2 and which are arranged in a matrix is used as at least either the display portion 7304 or the display portion 7305, or both, and the structure can include other accessories as appropriate. The portable game machine illustrated in FIG. 7C has a function of reading out a program or data stored in a storage medium to display it on the display portion, and a function of sharing information with another portable game machine by wireless communication. The portable game machine illustrated in FIG. 7C can have a variety of functions without limitation to the above. The portable game machine having the display portion 7304 can consume less power because the light-emitting elements used in the display portion 7304 have favorable emission efficiency. Since the light-emitting elements used in the display portion 7304 has low driving voltage, the portable game machine can also be a portable game machine having low driving voltage. In addition, since the light-emitting element described in Embodiment 1 or 2 is easily manufactured, the portable game machine can be provided at low cost.

FIG. 7D illustrates an example of a mobile phone. The mobile phone is provided with a display portion 7402 incorporated in a housing 7401, operation buttons 7403, an external connection port 7404, a speaker 7405, a microphone 7406, and the like. Note that the mobile phone 7400 has the display portion 7402 including the light-emitting elements each of which is described in Embodiment 1 and 2 and which are arranged in a matrix. The light-emitting elements can have favorable emission efficiency. In addition, the light-emitting element can have low driving voltage. Furthermore, the light-emitting element can have a long lifetime. Therefore, this mobile phone having the display portion 7402 which is formed using the light-emitting elements consumes less power. In addition, the mobile phone can have low driving voltage. Moreover, since the light-emitting element described in Embodiment 1 or 2 is easily manufactured, the mobile phone can be provided at low cost.

When the display portion 7402 of the mobile phone illustrated in FIG. 7D is touched with a finger or the like, data can be input into the mobile phone. In this case, operations such as making a call and creating an e-mail can be performed by touch on the display portion 7402 with a finger or the like.

There are mainly three screen modes of the display portion 7402. The first mode is a display mode mainly for displaying images. The second mode is an input mode mainly for inputting data such as text. The third mode is a display-and-input mode in which two modes of the display mode and the input mode are combined.

For example, in the case of making a call or composing an e-mail, a text input mode mainly for inputting text is selected for the display portion 7402 so that text displayed on a screen can be inputted. In this case, it is preferable to display a keyboard or number buttons on almost the entire screen of the display portion 7402.

When a detection device which includes a sensor for detecting inclination, such as a gyroscope or an acceleration sensor, is provided inside the mobile phone, the direction of the cellular phone (whether the cellular phone is placed horizontally or vertically for a landscape mode or a portrait mode) is determined so that display on the screen of the display portion 7402 can be automatically switched.

The screen modes are switched by touching the display portion 7402 or operating the operation buttons 7403 of the housing 7401. Alternatively, the screen modes can be switched depending on kinds of images displayed on the display portion 7402. For example, when a signal of an image displayed on the display portion is a signal of moving image data, the screen mode is switched to the display mode. When the signal is a signal of text data, the screen mode is switched to the input mode.

Moreover, in the input mode, when input by touching the display portion 7402 is not performed within a specified period while a signal detected by an optical sensor in the display portion 7402 is detected, the screen mode may be controlled so as to be switched from the input mode to the display mode.

The display portion 7402 may function as an image sensor. For example, an image of a palm print, a fingerprint, or the like is taken by touch on the display portion 7402 with the palm or the finger, whereby personal authentication can be performed. Further, by providing a backlight or a sensing light source which emits a near-infrared light in the display portion, an image of a finger vein, a palm vein, or the like can be taken.

Note that the structure described in this embodiment can be combined with any of the structures described in Embodiments 1 to 4 as appropriate.

As described above, the application range of the light-emitting device having the light-emitting element described in Embodiment 1 and 2 is wide so that this light-emitting device can be applied to electronic appliances in a variety of fields. By using the light-emitting element described in Embodiment 1 and 2, an electronic appliance having reduced power consumption can be obtained. In addition, the light-emitting element described in Embodiment 1 or 2 can be easily manufactured, the electronic appliance can be provided at low cost.

Figure 8:
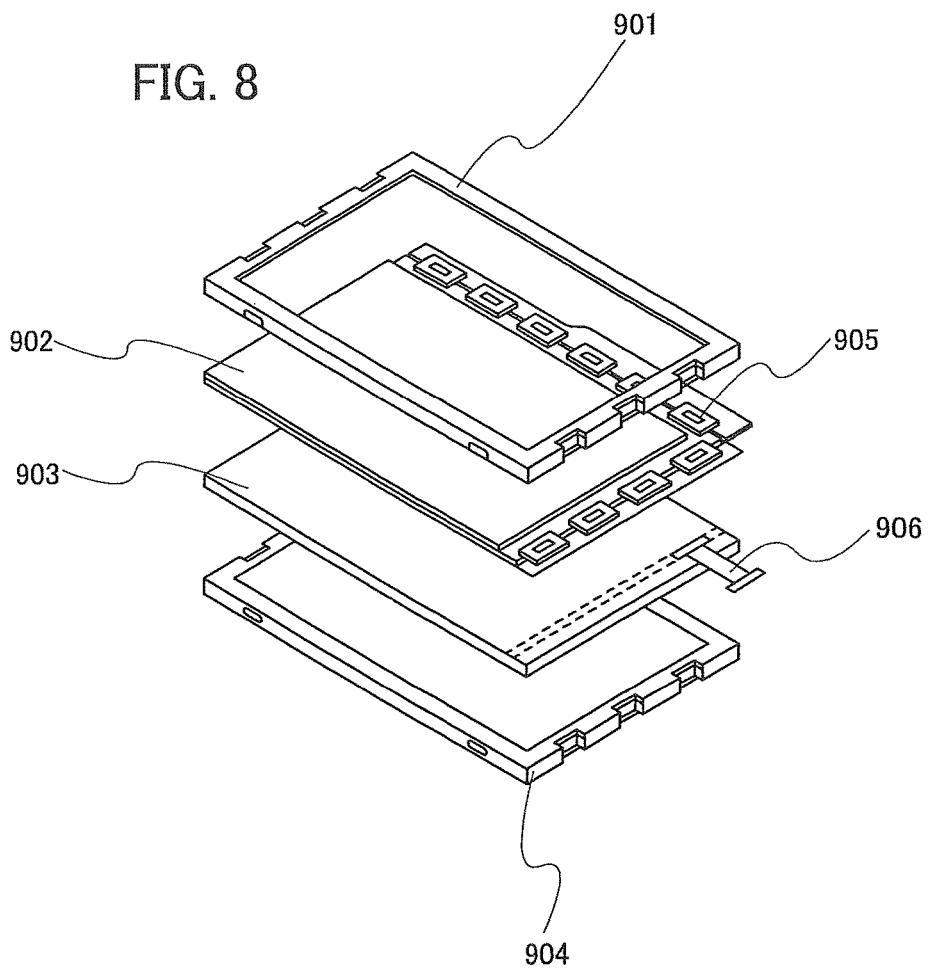
FIG. 8 illustrates an electronic appliance.

FIG. 8 illustrates an example of a liquid crystal display device using the light-emitting element described in Embodiment 1 and 2 for a backlight. The liquid crystal display device shown in FIG. 8 includes a housing 901, a liquid crystal layer 902, a backlight unit 903, and a housing 904. The liquid crystal layer 902 is connected to a driver IC 905. The light-emitting element described in Embodiment 1 and 2 is used for the backlight unit 903, to which current is supplied through a terminal 906.

The light-emitting element described in Embodiment 1 and 2 is used for the backlight of the liquid crystal display device; thus, the backlight can have reduced power consumption. In addition, the use of the light-emitting element described in Embodiment 2 enables manufacture of a planar-emission lighting device and further a larger-area planar-emission lighting device; therefore, the backlight can be a larger-area backlight, and the liquid crystal display device can also be a larger-area device. Furthermore, the light-emitting device using the light-emitting element described in Embodiment 2 can be thinner than a conventional one; accordingly, the display device can also be thinner.

Figure 9:
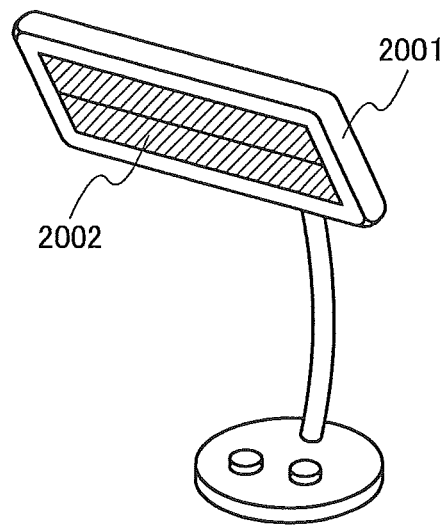
FIG. 9 illustrates a lighting device.

FIG. 9 illustrates an example in which the light-emitting element described in Embodiment 1 and 2 is used for a table lamp which is a lighting device. The table lamp illustrated in FIG. 9 includes a housing 2001 and a light source 2002, and the lighting device described in Embodiment 4 is used for the light source 2002.

Figure 10:
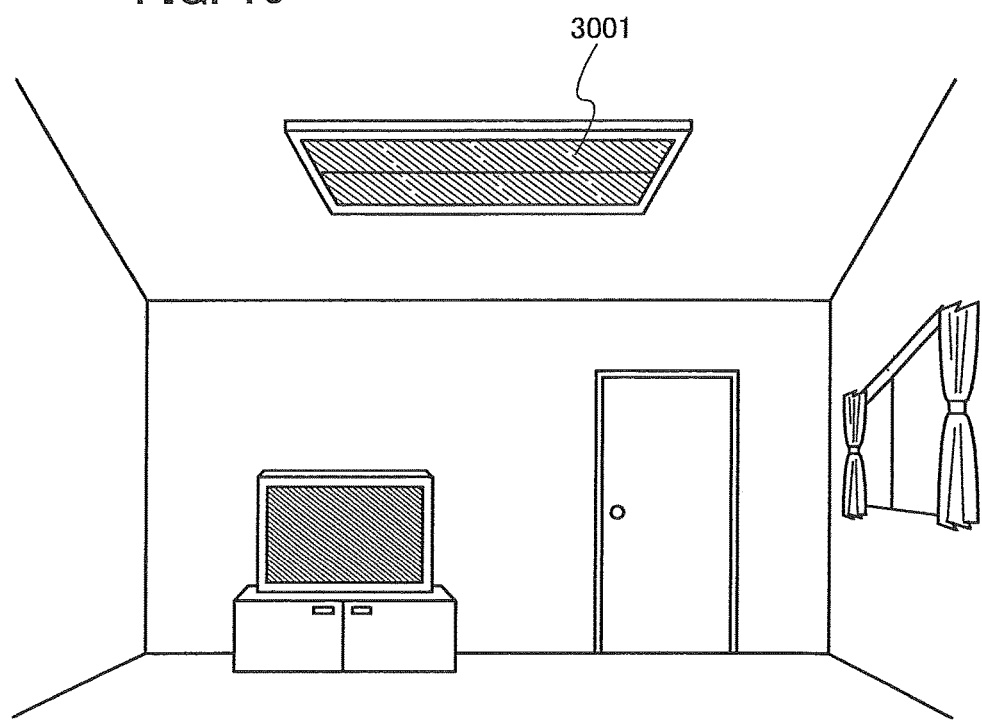
FIG. 10 illustrates a lighting device.

FIG. 10 illustrates an example in which the light-emitting element described in Embodiment 1 and 2 is used for an indoor lighting device 3001. Since the light-emitting element described in Embodiment 1 and 2 has reduced power consumption, a lighting device having reduced power consumption can be obtained. Further, since the light-emitting element described in Embodiment 1 and 2 can have a large area, the light-emitting element can be used for a large-area lighting device. Furthermore, since the light-emitting element described in Embodiment 1 and 2 is thin, the light-emitting element can be used for a lighting device having a reduced thickness.

Figure 11:
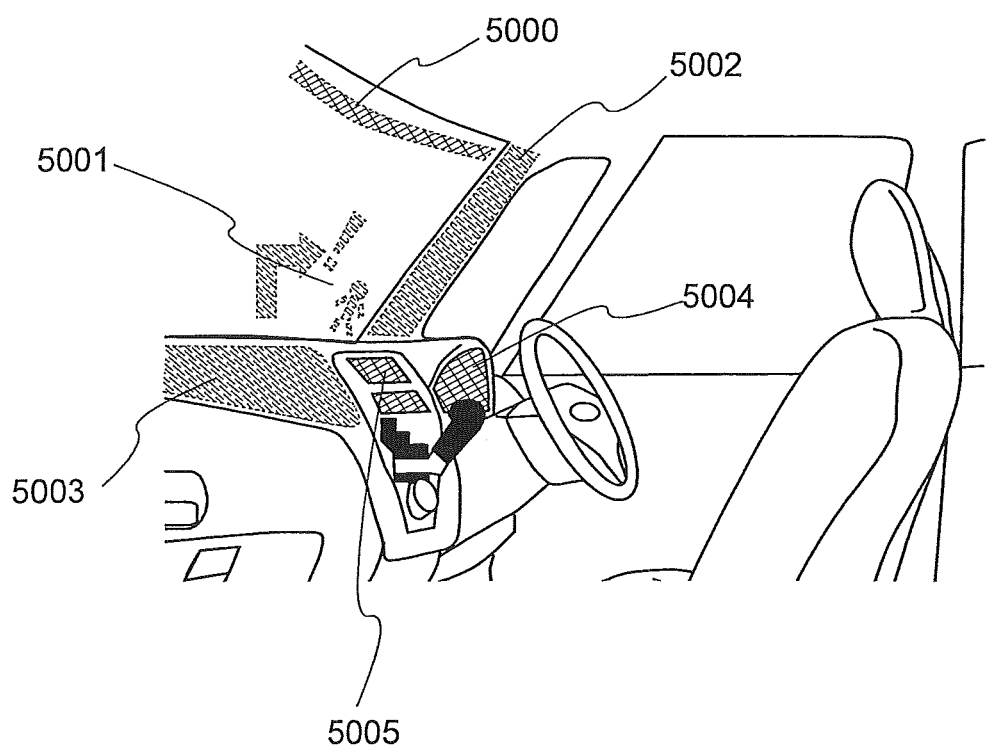
FIG. 11 illustrates in-vehicle display devices and lighting devices.

The light-emitting element described in Embodiment 1 and 2 can also be used for an automobile windshield or an automobile dashboard. FIG. 11 illustrates one mode in which the light-emitting element described in Embodiment 2 is used for an automobile windshield and an automobile dashboard. Displays 5000 to 5005 each include the light-emitting elements described in Embodiments 1 and 2.

The display 5000 and the display 5001 are provided in the automobile windshield in which the light-emitting elements described in Embodiment 1 and 2 are incorporated. The light-emitting element described in Embodiment 1 and 2 can be formed into what is called a see-through display device, through which the opposite side can be seen, by including a first electrode and a second electrode formed of electrodes having light-transmitting properties. Such see-through display devices can be provided even in the automobile windshield, without hindering the vision. Note that in the case where a transistor for driving or the like is provided, a transistor having a light-transmitting property, such as an organic transistor using an organic semiconductor material or a transistor using an oxide semiconductor, is preferably used.

A display device incorporating the light-emitting element described in Embodiment 1 and 2 is provided in the display 5002 in a pillar portion. The display 5002 can compensate for the view hindered by the pillar portion by showing an image taken by an imaging unit provided in the car body. Similarly, the display 5003 provided in the dashboard can compensate for the view hindered by the car body by showing an image taken by an imaging unit provided in the outside of the car body, which leads to elimination of blind areas and enhancement of safety. Showing an image so as to compensate for the area which a driver cannot see makes it possible for the driver to confirm safety easily and comfortably.

The display 5004 and the display 5005 can provide a variety of kinds of info illation such as navigation data, a speedometer, a tachometer, a mileage, a fuel meter, a gearshift indicator, and air-condition setting. The content or layout of the display can be changed freely by a user as appropriate. Further, such information can also be shown by the displays 5000 to 5003. Note that the displays 5000 to 5005 can also be used as lighting devices.

The light-emitting element described in Embodiment 1 and 2 can have high emission efficiency and low power consumption. Therefore, load on a battery is small even when a number of large screens such as the displays 5000 to 5005 are provided, which provides comfortable use. For that reason, the light-emitting device and the lighting device each of which includes the light-emitting element described in Embodiment 1 and 2 can be suitably used as an in-vehicle light-emitting device and an in-vehicle lighting device.

Figure 12A:
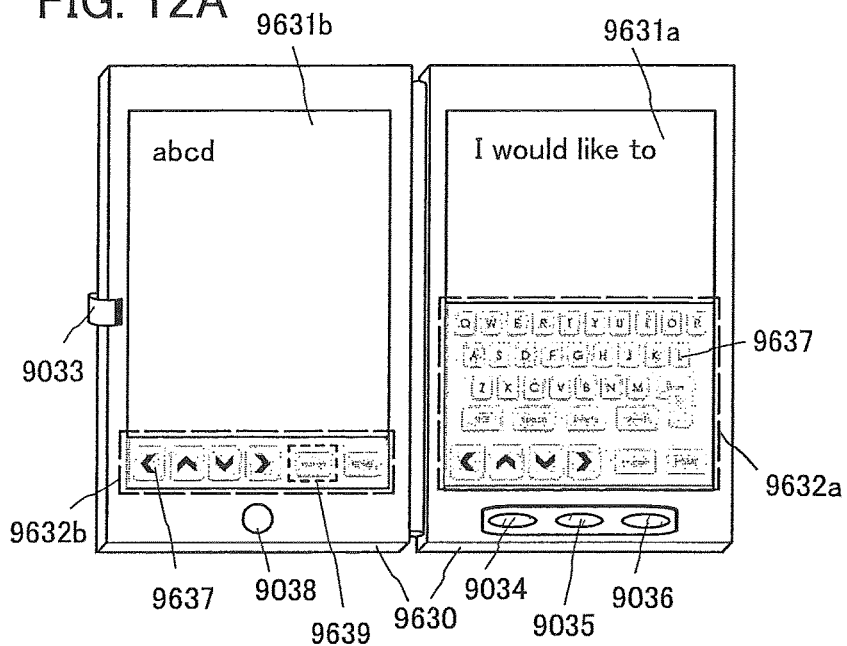
FIGS. 12A to 12C illustrate an electronic appliance.
Figure 12B:
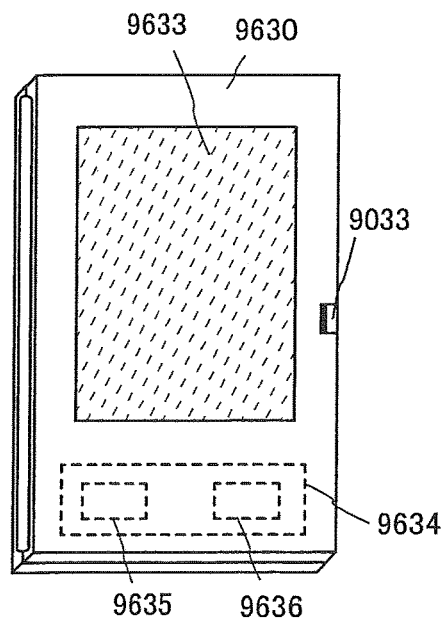

FIGS. 12A and 12B illustrate an example of a foldable tablet terminal. The tablet terminal is opened in FIG. 12A. The tablet terminal includes a housing 9630, a display portion 9631a, a display portion 9631b, a display mode switch 9034, a power switch 9035, a power saver switch 9036, a clasp 9033, and an operation switch 9038. Note that in the tablet terminal, one or both of the display portion 9631a and the display portion 9631b is/are formed using a light-emitting device which includes the light-emitting element described in Embodiment 1 and 2.

Part of the display portion 9631a can be a touchscreen region 9632 a and data can be input when a displayed operation key 9637 is touched. Although half of the display portion 9631a has only a display function and the other half has a touchscreen function, one embodiment of the present invention is not limited to the structure. The whole display portion 9631a may have a touchscreen function. For example, a keyboard can be displayed on the entire region of the display portion 9631a so that the display portion 9631a is used as a touchscreen, and the display portion 9631b can be used as a display screen.

Like the display portion 9631a, part of the display portion 9631b can be a touchscreen region 9632b. A switching button 9639 for showing/hiding a keyboard of the touch panel is touched with a finger, a stylus, or the like, so that keyboard buttons can be displayed on the display portion 9631b.

Touch input can be performed in the touchscreen region 9632 a and the touchscreen region 9632b at the same time.

The display mode switch 9034 can switch the display between portrait mode, landscape mode, and the like, and between monochrome display and color display, for example. With the switch 9036 for switching to power-saving mode, the luminance of display can be optimized in accordance with the amount of external light at the time when the tablet is in use, which is detected with an optical sensor incorporated in the tablet. The tablet may include another detection device such as a sensor for detecting orientation (e.g., a gyroscope or an acceleration sensor) in addition to the optical sensor.

Although FIG. 12A illustrates an example in which the display portion 9631a and the display portion 963b have the same display area, one embodiment of the present invention is not limited to the example. The display portion 9631a and the display portion 9631b may have different display areas and different display quality. For example, one of them may be a display panel that can display higher-definition images than the other.

The tablet terminal is folded in FIG. 12B. The tablet terminal includes the housing 9630, a solar cell 9633, a charge and discharge control circuit 9634, a battery 9635, and a DC-to-DC converter 9636. Note that FIG. 12B illustrates an example in which the charge and discharge control circuit 9634 includes the battery 9635 and the DC-to-DC converter 9636.

Since the tablet terminal can be folded, the housing 9630 can be closed when not in use. Thus, the display portions 9631a and 9631b can be protected, thereby providing a tablet terminal with high endurance and high reliability for long-term use.

In addition, the tablet terminal illustrated in FIGS. 12A and 12B can have a function of displaying various kinds of information (e.g., a still image, a moving image, and a text image) on the display portion, a function of displaying a calendar, the date, the time, or the like on the display portion, a touch input function of operating or editing information displayed on the display portion by touch input, a function of controlling processing by various kinds of software (programs), and the like.

The solar cell 9633, which is attached on the surface of the tablet terminal, supplies electric power to a touch panel, a display portion, an image signal processor, and the like. Note that the solar cell 9633 is preferably provided on one or two surfaces of the housing 9630, in which case the battery 9635 can be charged efficiently.

Figure 12C:
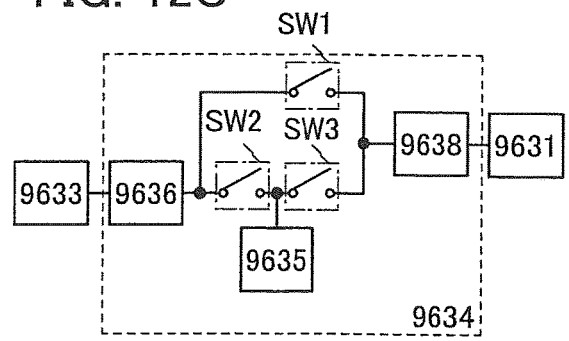

The structure and operation of the charge and discharge control circuit 9634 illustrated in FIG. 12B are described with reference to a block diagram of FIG. 12C. FIG. 12C shows the solar cell 9633, the battery 9635, the DC-to-DC converter 9636, a converter 9638, switches SW1 to SW3, and the display portion 9631. The battery 9635, the DC-to-DC converter 9636, the converter 9638, and the switches SW1 to SW3 correspond to the charge and discharge control circuit 9634 in FIG. 12B.

First, an example of operation in the case where power is generated by the solar cell 9633 using external light is described. The voltage of power generated by the solar cell is raised or lowered by the DC-to-DC converter 9636 so that the power has voltage for charging the battery 9635. Then, when power supplied from the battery 9635 charged by the solar cell 9633 is used for the operation of the display portion 9631, the switch SW1 is turned on and the voltage of the power is raised or lowered by the converter 9638 so as to be voltage needed for the display portion 9631. In addition, when display on the display portion 9631 is not performed, the switch SW1 is turned off and a switch SW2 is turned on so that charge of the battery 9635 may be performed.

Although the solar cell 9633 is described as an example of a power generation means, the power generation means is not particularly limited, and the battery 9635 may be charged by another power generation means such as a piezoelectric element or a thermoelectric conversion element (Peltier element). The battery 9635 may be charged by a non-contact power transmission module which is capable of charging by transmitting and receiving power by wireless (without contact), or another charge means used in combination, and the power generation means is not necessarily provided.

One embodiment of the present invention is not limited to the tablet terminal having the shape illustrated in FIGS. 12A to 12C as long as the display portion 9631 is included.

This application is based on Japanese Patent Application Ser. No. 2012-172937 filed with Japan Patent Office on Aug. 3, 2012, the entire contents of which are hereby incorporated by reference.

What is claimed is:

1. A light-emitting element comprising:
a first electrode;
a second electrode; and
a first light-emitting layer over the first electrode, the first light-emitting layer comprising a first organic compound and a second organic compound,
a second light-emitting layer over the first light-emitting layer, the second light-emitting layer comprising a third organic compound and a fourth organic compound,
wherein the first organic compound and the second organic compound are mixed in the first light-emitting layer,
wherein the third organic compound and the fourth organic compound are mixed in the second light-emitting layer,
wherein the second organic compound is capable of forming a first exciplex with the first organic compound,
wherein the fourth organic compound is capable of forming a second exciplex with the third organic compound,
wherein the first exciplex has a first emission peak,
wherein the second exciplex has a second emission peak, and
wherein the first emission peak and the second emission peak are different from each other.

2. The light-emitting element according to claim 1, wherein light emission is obtained from the first exciplex and the second exciplex.

3. The light-emitting element according to claim 1, wherein a difference in energy between a singlet excited level and a triplet excited level of at least one of the first exciplex and the second exciplex is 0.2 eV or lower.

4. The light-emitting element according to claim 1, wherein at least one of the first exciplex and the second exciplex exhibits delayed fluorescence.

5. The light-emitting element according to claim 1,
wherein the first organic compound is a material having an electron-transport property,
wherein the second organic compound is a material having a hole-transport property,
wherein the third organic compound is a material having an electron-transport property, and
wherein the fourth organic compound is a material having a hole-transport property.

6. The light-emitting element according to claim 5,
wherein the first electrode functions as an anode, and the second electrode functions as a cathode,
wherein the first light-emitting layer comprises a larger amount of the material having the hole-transport property than the second light-emitting layer, and
wherein the second light-emitting layer comprises a larger amount of the material having the electron-transport property than the first light-emitting layer.

7. The light-emitting element according to claim 1, wherein an emission spectrum of the light-emitting element has two peaks.

8. The light-emitting element according to claim 1, wherein one of the first organic compound and the second organic compound is the same as one of the third organic compound and the fourth organic compound.

9. The light-emitting element according to claim 1, wherein the light-emitting layer exhibits white light emission.

10. A light-emitting device comprising:
the light-emitting element according to claim 1; and
a flexible substrate.

11. A lighting device comprising the light-emitting element according to claim 1.

12. An electronic appliance comprising the light-emitting element according to claim 1,
wherein the electronic appliance is one of television devices, monitors for computers, digital cameras and digital video cameras, digital photo frames, mobile phones, portable game machines, portable information terminals, audio playback devices and game machines.

13. A light-emitting element comprising:
a first electrode;
a second electrode; and
a first light-emitting layer over the first electrode, the first light-emitting layer comprising a first organic compound and a second organic compound,
a second light-emitting layer over the first light-emitting layer, the second light-emitting layer comprising a third organic compound and a fourth organic compound,
wherein the first organic compound and the second organic compound are mixed in the first light-emitting layer, wherein the third organic compound and the fourth organic compound are mixed in the second light-emitting layer, wherein the second organic compound is capable of forming a first exciplex with the first organic compound, wherein the fourth organic compound is capable of forming a second exciplex with the third organic compound, wherein the first exciplex has a first emission peak, wherein the second exciplex has a second emission peak, wherein the first emission peak and the second emission peak are different from each other, and wherein emission of the light-emitting element includes emission of the first exciplex and emission the second exciplex.

14. The light-emitting element according to claim 13, wherein one of the first organic compound and the second organic compound is the same as one of the third organic compound and the fourth organic compound.

15. The light-emitting element according to claim 13, wherein the light-emitting layer exhibits white light emission.

16. The light-emitting element according to claim 13, wherein the first organic compound is a material having an electron-transport property, wherein the second organic compound is a material having a hole-transport property, wherein the third organic compound is a material having an electron-transport property, wherein the fourth organic compound is a material having a hole-transport property, wherein an amount ratio of the second organic compound to the first organic compound in the first light-emitting layer is larger than an amount ratio of the fourth organic compound to the third organic compound in the second light-emitting layer, and wherein an amount ratio of the first organic compound to the second organic compound in the first light-emitting layer is larger than an amount ratio of the third organic compound to the fourth organic compound in the second light-emitting layer.

17. A light-emitting device comprising:
the light-emitting element according to claim 13; and
a flexible substrate.

18. A lighting device comprising the light-emitting element according to claim 13.

19. An electronic appliance comprising the light-emitting element according to claim 13, wherein the electronic appliance is one of television devices, monitors for computers, digital cameras and digital video cameras, digital photo frames, mobile phones, portable game machines, portable information terminals, audio playback devices and game machines.

* * * * *